United States Patent
Hariri et al.

(10) Patent No.: US 11,552,019 B2
(45) Date of Patent: Jan. 10, 2023

(54) SUBSTRATE PATCH RECONSTITUTION OPTIONS

(71) Applicant: Intel Corporation, Santa Clara, CA (US)

(72) Inventors: Haifa Hariri, Phoenix, AZ (US); Amruthavalli P. Alur, Chandler, AZ (US); Wei-Lun K. Jen, Chandler, AZ (US); Islam A. Salama, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 789 days.

(21) Appl. No.: 16/299,415

(22) Filed: Mar. 12, 2019

(65) Prior Publication Data
US 2020/0294920 A1 Sep. 17, 2020

(51) Int. Cl.
*H01L 23/538* (2006.01)
*H01L 23/31* (2006.01)

(52) U.S. Cl.
CPC ...... *H01L 23/5381* (2013.01); *H01L 23/3192* (2013.01); *H01L 23/5383* (2013.01)

(58) Field of Classification Search
CPC ............. H01L 23/5381; H01L 23/3192; H01L 23/5383
See application file for complete search history.

(56) References Cited

U.S. PATENT DOCUMENTS

| | | | | |
|---|---|---|---|---|
| 6,717,821 B2* | 4/2004 | Miller | ............... | H05K 1/023 361/793 |
| 2011/0156276 A1* | 6/2011 | Roberts | ............... | H05K 1/112 257/E23.169 |
| 2015/0171015 A1* | 6/2015 | Mahajan | ............... | H01L 23/3114 257/774 |

* cited by examiner

*Primary Examiner* — Peniel M Gumedzoe
(74) *Attorney, Agent, or Firm* — Schwabe, Williamson & Wyatt, P.C.

(57) ABSTRACT

Embodiments include semiconductor packages. A semiconductor package includes a first patch and a second patch on an interposer. The semiconductor package also includes a first substrate in the first patch, and a second substrate in the second patch. The semiconductor package further includes an encapsulation layer over and around the first and second patches, a plurality of build-up layers on the first patch, the second patch, and the encapsulation layer, and a plurality of dies and a bridge on the build-up layers. The bridge may be communicatively coupled with the first substrate of the first patch and the second substrate of the second patch. The bridge may be an embedded multi-die interconnect bridge (EMIB). The first and second substrates may be EMIBs and/or high-density packaging (HDP) substrates. The bridge may be positioned between two dies, and over an edge of the first patch and an edge of the second patch.

26 Claims, 11 Drawing Sheets

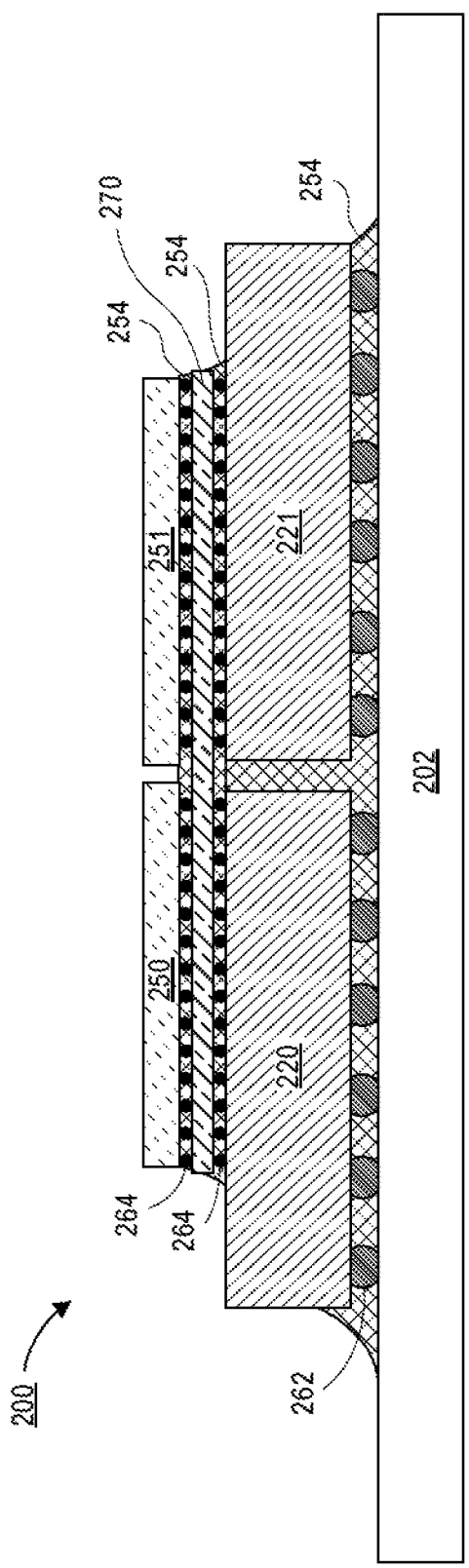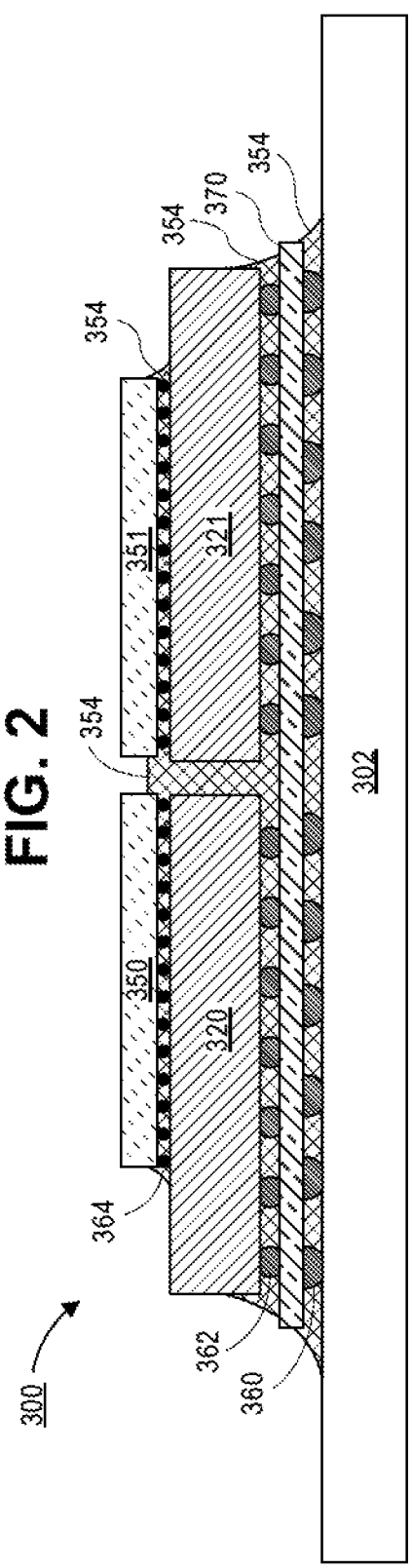

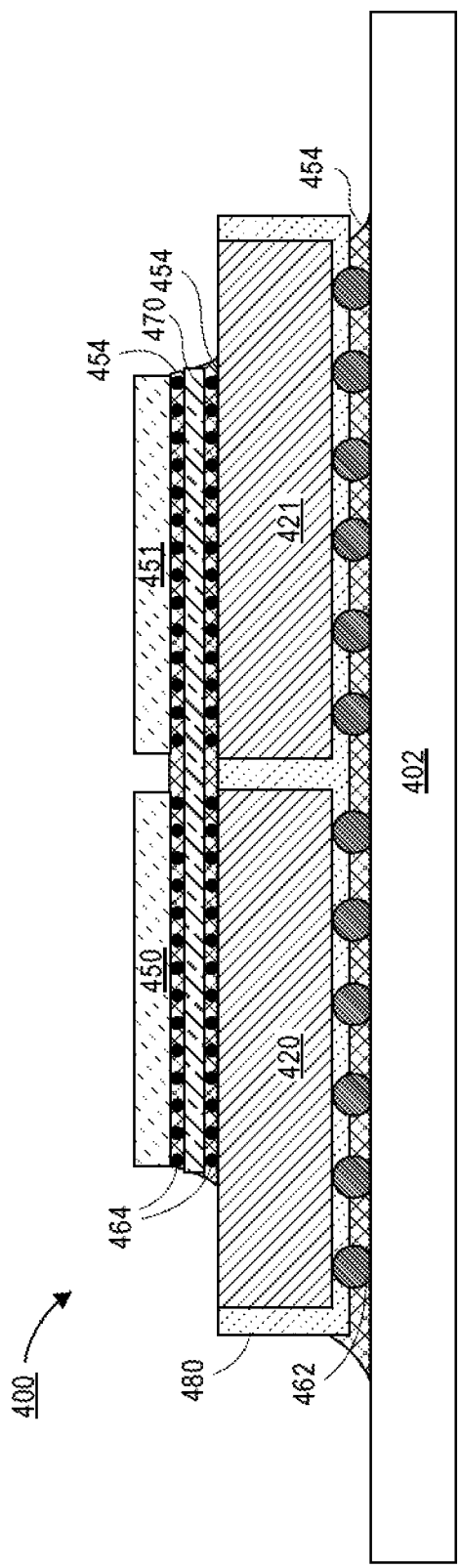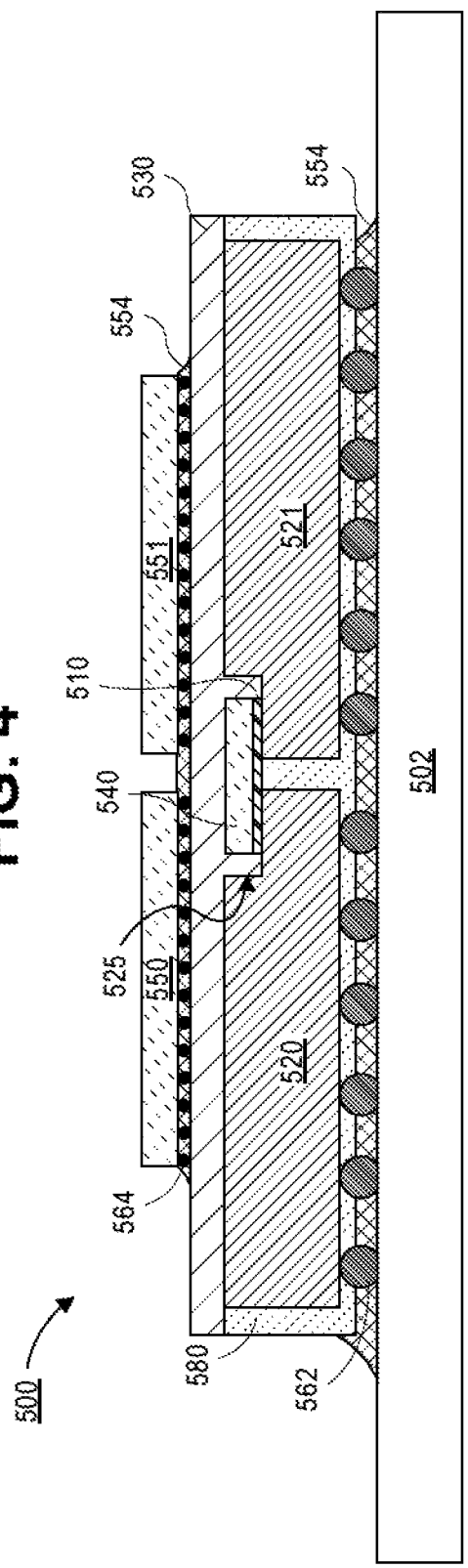

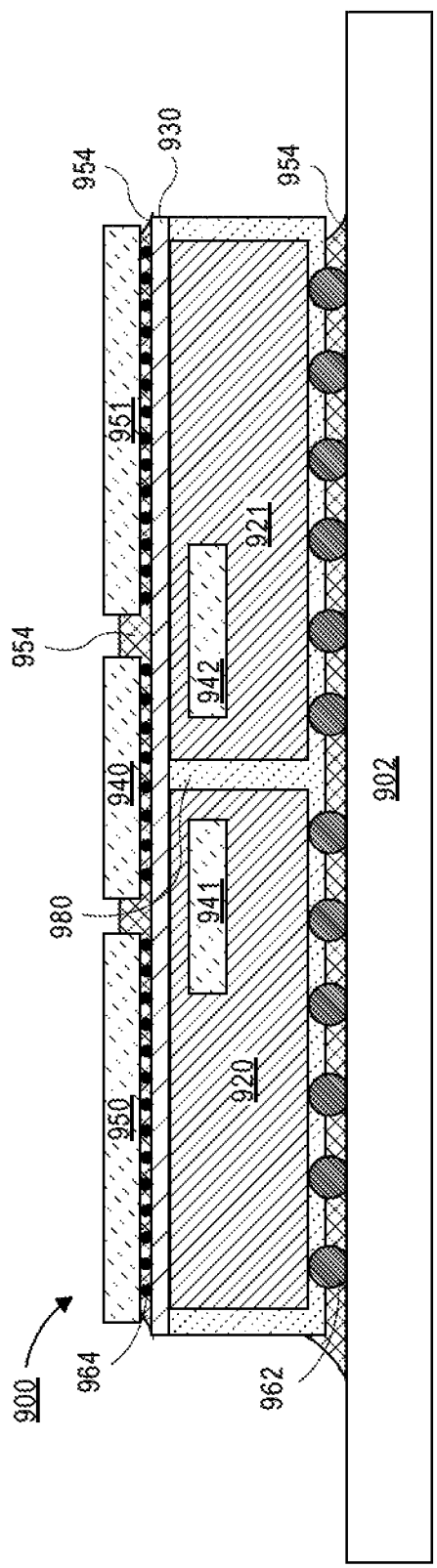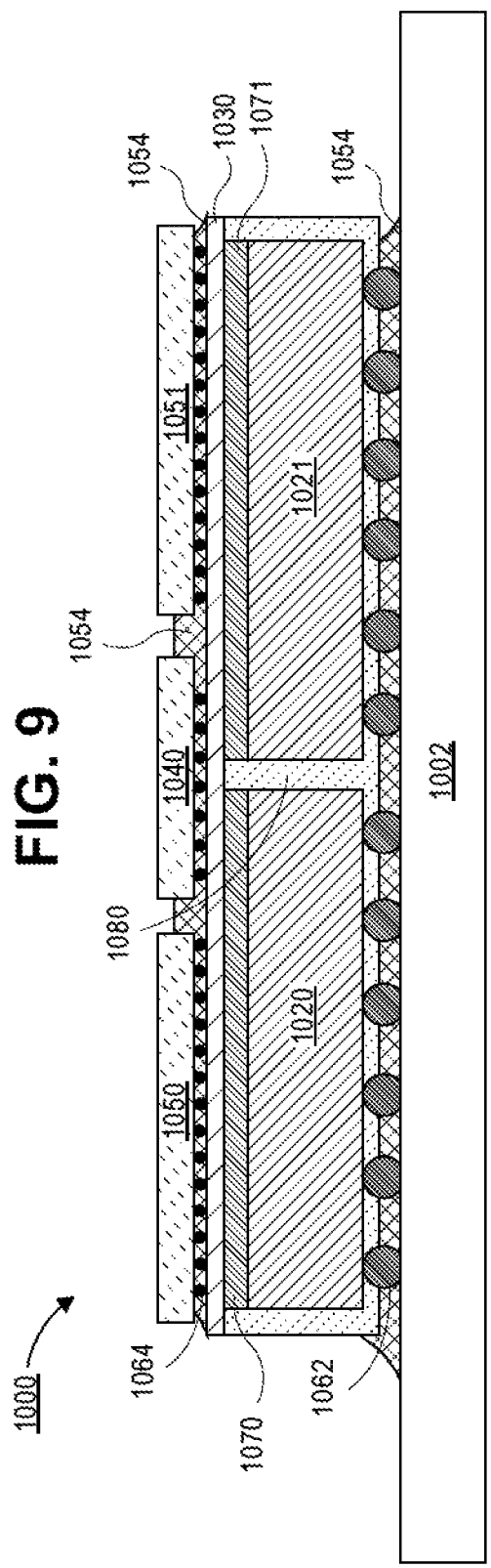
FIG. 9
FIG. 10

SUBSTRATE PATCH RECONSTITUTION OPTIONS

FIELD

Embodiments relate to packaging semiconductor devices. More particularly, the embodiments relate to semiconductor devices with interconnected dies using patch on interposer (POINT) architecture.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. For example, conventional die manufacturing techniques are being pushed to their limits for size of a monolithic die, yet applications are yearning for capabilities that are possible for large dimensional integrated circuits using the latest technology. The drive for ever-more capacity, however, is not without issue. The necessity to optimize the performance of each device becomes increasingly significant.

As monolithic dies have become bigger, small differences that can be overlooked for smaller dies, cannot be compensated for and can often significantly reduce yield. Recent solutions can involve using patch on interposer (POINT) architecture which is used to reduce packaging costs for server products and other electronic products. A POINT typically includes smaller integrated circuits interconnected with a printed circuit board (PCB)-like interposer.

Existing POINT architecture provides cost benefits as it allows for making the higher density routing layers into a smaller patch, and the rest of the layers may be made by a cheaper interposer process. However, as the die size grows and consequently the patch size also grows, POINT architecture may no longer be cost beneficial relative to monolithic packages. Conversely, switching from POINT architectures to monolithic packages/substrates impacts substrate yield, cost, and front end capacity.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 2 is an illustration of a cross-sectional view of a semiconductor package with a plurality of dies, a plurality of patches, a substrate, and an interposer, according to one embodiment.

FIG. 3 is an illustration of a cross-sectional view of a semiconductor package with a plurality of dies, a plurality of patches, a substrate, and an interposer, according to one embodiment.

FIG. 4 is an illustration of a cross-sectional view of a semiconductor package with a plurality of dies, a plurality of patches, a substrate, an encapsulation layer, and an interposer, according to one embodiment.

FIG. 5 is an illustration of a cross-sectional view of a semiconductor package with a plurality of dies, a plurality of patches, a bridge in a cavity, an encapsulation layer, a plurality of build-up layers, and an interposer, according to one embodiment.

FIG. 9 is an illustration of a cross-sectional view of a semiconductor package with a plurality of dies, a plurality of patches, a plurality of bridges, an encapsulation layer, a plurality of build-up layers, and an interposer, according to one embodiment.

FIG. 10 is an illustration of a cross-sectional view of a semiconductor package with a plurality of dies, a plurality of patches, a plurality of substrates, an encapsulation layer between the plurality of dies, a plurality of build-up layers, and an interposer, according to one embodiment.

DETAILED DESCRIPTION

Figure 1A:
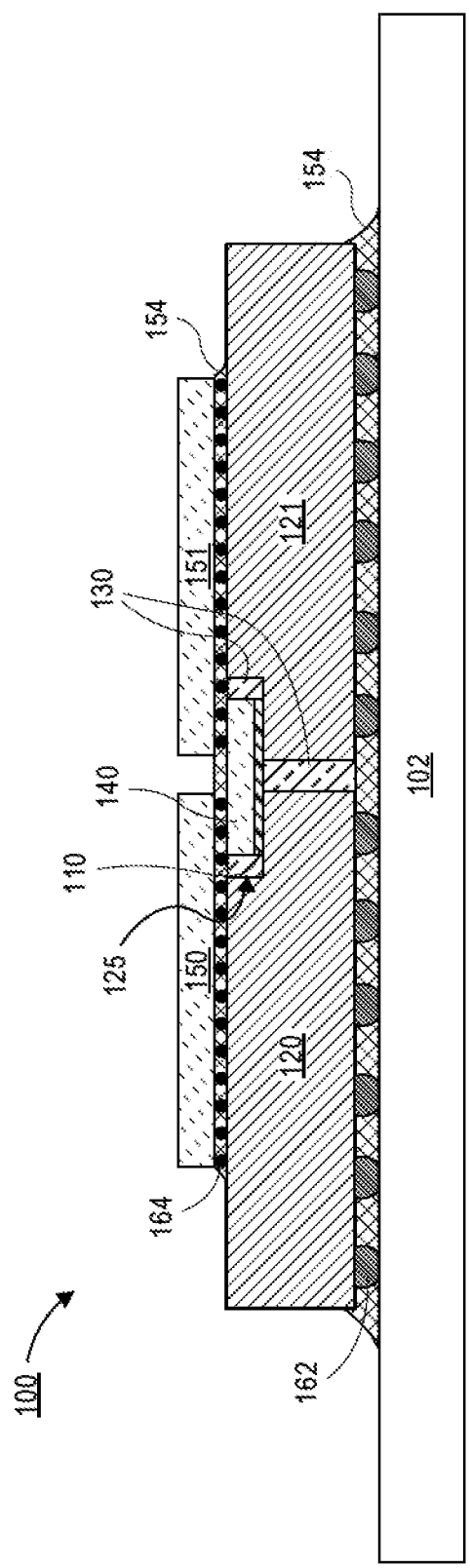
FIG. 1A is an illustration of a cross-sectional view of a semiconductor package with a plurality of dies, a plurality of patches, a bridge in a cavity, and an interposer, according to one embodiment.

Described herein are semiconductor packages with interconnected dies implemented with patch on interposer (POINT) architecture. Embodiments of a semiconductor package may include a plurality of dies, a plurality of patches, a plurality of bridges (or a plurality of substrates), an encapsulation layer, a plurality of build-up layers, and an interposer.

As described herein, a "POINT" package (or a "POINT" architecture) may refer to one or more patches coupled to an interposer, which may be integrated on a server packaged system. In particular, the POINT package may refer to patches disposed on/over the interposer as the patches enable communicatively coupling a plurality of dies (or other substrates) to the interposer.

As described herein, a "patch" may refer to a multilayer organic package substrate implemented with build-up layers and advanced substrate design rules. The design rules may be compatible with the latest silicon nodes. This allows dies to be assembled on a patch with a fine C4 bump pitch of a few hundred to less than 100 µm. In some embodiments, the patch described herein may include a core (e.g., a thick or thin core based on the desired packaging design) and a plurality of build-up layers, which may include interconnect structures such as conductive layers, solder balls, and dielectrics. The patch may enable routing and power delivery functions for a semiconductor package/system.

The embodiments of the semiconductor packages described herein improve packaging solutions by stitching (or communicatively coupling) patches together to keep patch size small, while also addressing the need for larger die (i.e., the size of die needs to be less than the size of the patch as such, in these embodiments, a semiconductor package may be able to integrate a plurality of different smaller dies on a smaller substrate, so the overall die area used per package may be larger) and more complex die integration. Molding (or stitching) two patches together and coupling them with a high routing density substrate/interface (e.g., a high-density packaging (HDP) substrate, or a silicon (Si) bridge) enables manufacturing a smaller form-factor patch and provides improved packaging solution for large die complex products. This facilitates the use of POINT architecture across the server environment where the total die area are growing bigger, and helps to improve substrate cost, yield, and capacity.

The embodiments described herein include semiconductor packages with patches that may be manufactured separately, singulated, and then attached to the interposer. In addition, the embodiments of the semiconductor packages include patches that are coupled with high density Si bridges and/or HDP substrates, which are used for die-to-die communication across the patches. Some of the embodiments described below include semiconductor packages that initially attach the patches together with either Si bridges and/or HDP substrates, and then these reconstituted patches are subsequently attached/coupled to the interposer. Other embodiments described below include semiconductor packages that may mold the patches together prior to attaching the patches to the interposer, which reduces the impact of the thickness variations of the patches and the patch-to-patch connections of the assembly process. The patch-to-patch connections described herein may be implemented with Si bridges and/or HDP substrates. Additionally, some of the embodiments include patches that may be tested separately before molding the patches together and attaching them to the interposer.

The technologies described herein may be implemented in one or more electronic devices, in particular to server devices (e.g., blade server, rack mount server, combinations thereof, etc.). Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers, set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages having dies, patches, bridges, substrates, encapsulation layers, underfill layers, build-up layers, and/or interposers.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1A, a cross-sectional illustration of a semiconductor package 100 is shown, in accordance with an embodiment. In an embodiment, the semiconductor package 100 may include a plurality of patches 120-121 disposed on/over an interposer 102. For one embodiment, the patches 120-121 may be coupled to the interposer 102 with a plurality of first solder balls 162. In an embodiment, an underfill material 154 may surround the first solder balls 162 below the patches 120-121.

In one embodiment, the interposer 102 may include one or more electronic/conductive structures such as conductive vias, traces, pads, etc., formed thereon or therein. The interposer 102 may be used to couple one or more electronic devices, including the patches 120-121, a plurality of dies 150-151, and a bridge 140, to another package substrate, such as a printed circuit board (PCB) and/or a motherboard. For one embodiment, the interposer 102 may include one or more different materials, such as an organic substrate made up of one or more layers of polymer base material(s) having conducting regions for transmitting signals, and/or one or more layers of ceramic base material(s) having conductive regions for transmitting signals. The conductive structures/regions of the interposer 102 may variously comprise an alloy of nickel, palladium, and/or tin (and, in some embodiments, copper or other similar metal(s)).

In an embodiment, the patches 120-121 may be multilayer organic package substrates implemented with build-up layers and advanced substrate design rules, which may be compatible with the latest silicon nodes. In some embodiments, the patches 120-121 may include a thin core and a plurality of build-up layers, where the build-up layers may include interconnect structures such as conductive layers, solder balls, and dielectrics.

As shown in FIG. 1A, the patches 120-121 may have a cavity 125 that surrounds (or embeds) the bridge 140. In an embodiment, the patches 120-121 may be communicatively coupled by the bridge 140. In an embodiment, the bridge 140 may comprise electrical routing (or interconnect structures) to communicative couple the patch 120 to the patch 121. In an embodiment, the bridge 140 may be coupled to the patches 120-121 by an adhesive layer 110 (or an adhesive film).

In an embodiment, the bridge 140 may be a silicon bridge or a bridge made of any other substrate material that is suitable for forming bridges. In some embodiments, the bridge 140 may be referred to as an embedded multi-die interconnect bridge (EMIB). In an embodiment, the bridge 140 allows for the combined area of a plurality of dies 150-151 to be greater than the reticle limit used to form active devices on the dies 150-151. In a particular embodiment, the patches 120-121 may have a thickness (or a z-height) of approximately 200 μm to 2.5 mm. In additional embodiments, the patches 120-121 may have a thickness of approximately 50 μm to 2.5 mm. Note that, in an alternate embodiment, the patch 120 may have a thickness that is substantially/nominally equal to a thickness of the patch 121.

In an embodiment, the bridge 140 may be disposed in the cavity 125 between the patches 120-121, and embedded within an encapsulation material layers 130 that may include an underfill material, a filler material, or the like. In one embodiment, the cavity 125 may have a thickness that is approximately equal to a thickness of the bridge 140 with the adhesive layer 110. For example, in a particular embodiment, the bridge 140 may have a thickness of approximately 10 μm to 70 μm.

In an embodiment, the encapsulation material layers 130 may be disposed below the dies 150-151 and between the patches 120-121, and may also surround (or embed) the bridge 140 with the adhesive layer 110. For one embodiment, the semiconductor package 100 may include one or more build-up layers that may include a plurality of dielectrics. In one embodiment, the dielectrics may include a polymer material such as, for example, a polyimide, an epoxy, or a build-up film (BF).

For one embodiment, the encapsulation material layers 130 may surround the bridge 140 within the cavity 125, and the encapsulation material layers 130 may be disposed over and between the patches 120-121. For example, as shown in FIG. 1B, the encapsulation material layers 130 may be disposed over dielectrics, conductive layers (e.g., the conductive traces 111-113, the vias 131-132, etc.,) of the semiconductor package 100.

In an embodiment, the dies 150-151 may be disposed over the bridge 140 and the patches 120-121. For example, each of the dies 150-151 may have an outer edge that is positioned over the bridge 140. While one bridge 140 and two dies 150-151 are illustrated, it is to be appreciated that any number of bridges 140 and dies 150-151 may be positioned over the patches 120-121. In an embodiment, the dies 150-151 may be electrically coupled to the bridge 140 and the patches 120-121 with a plurality of second solder balls 164 and first level interconnects (FLI) 113 (as shown in FIG. 1B).

For one embodiment, the dies 150-151 may include, but are not limited to, a semiconductor die, an electronic device (e.g., a wireless device), an integrated circuit (IC), a central processing unit (CPU), a microprocessor, a platform controller hub (PCH), a memory, a graphic processing unit (GPU), and/or a field-programmable gate array (FPGA). The dies 150-151 may be formed from a material such as silicon and have circuitry thereon that is to be coupled to the bridge 140 and/or the patches 120-121.

Figure 1B:
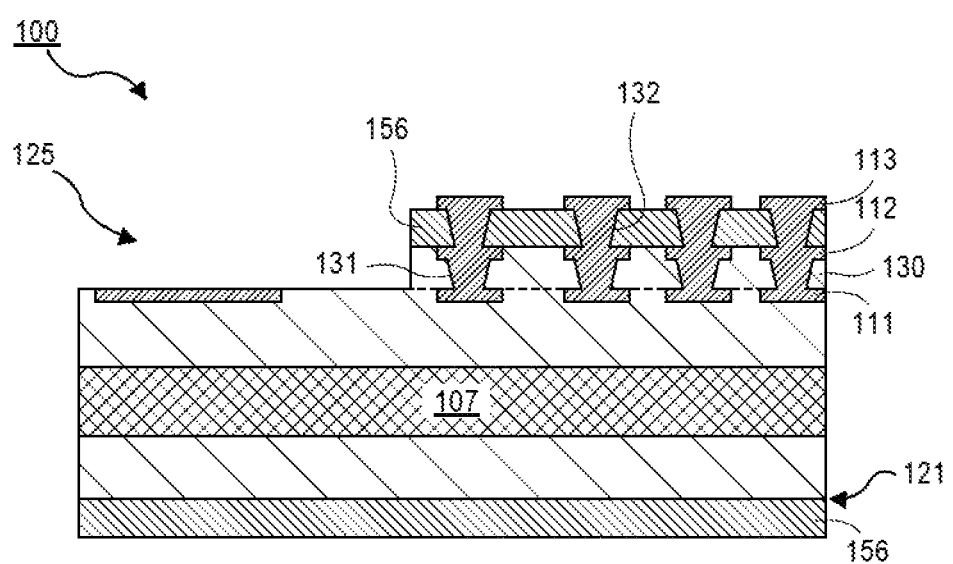
FIG. 1B is a detailed illustration of a cross-sectional view of a respective semiconductor package with a cavity, a plurality of build-up layers, in a patch, according to one embodiments.

In an embodiment, the underfill material 154 may surround the second solder balls 164 and the FLIs 113 (as shown in FIG. 1B) below the dies 150-151. In an embodiment, the dies 150-151 may also be communicatively coupled to each other by conductive traces (or interconnect structures) within the bridge 140. In an embodiment, the dies 150-151 are both active dies (i.e., the die 150 and the die 151 may each comprise active devices, such as transistors or the like). In an embodiment, the dies 150-151 may include active device at a processing node. In a particular embodiment, the processing node is an advanced node (i.e., the node has smaller transistor gate lengths). However, it is to be appreciated that the node may be any processing node.

Referring now to FIG. 1B, a detailed cross-sectional illustration of the semiconductor package 100 with the encapsulation material layers 130 is shown, in accordance with an embodiment. In one embodiment, the detailed cross-sectional illustration of a portion of the encapsulation material layers 130 is shown, as the portion of the cavity 125 above the patch 121 is shown prior to disposing the bridge into the cavity 125.

In an embodiment, as shown in FIG. 1A, a redistribution layer (RDL) may be disposed over the patches 120-121 and the bridge 140. The illustrated RDL is shown as having a dielectric build-up layer for simplicity, and those skilled in the art will recognize that the RDL may include a plurality of build-up layers. The RDL may also include a plurality of conductive traces 111-113 and vias 131-132, as is known in the art. In an embodiment, solder resist layers 156 may be disposed over the RDL to provide isolation for the FLIs 113 coupled to the dies and second level interconnects (SLIs) coupled to the interposer, such as solder bumps (e.g., as shown with the first and second solder balls 162 and 164 of FIG. 1A) or the like.

In one embodiment, as described above, the patch 121 may include a core layer 107, and alternating layers of organic build-up layers and conductive (e.g., copper) routing layers (or conductive interconnect structures), as is known in the art. In an embodiment, the traces 111-112 and the vias 131-132 may electrically couple the FLIs 113 over the patch 121 to the subsequently disposed bridge and the die and other components and/or circuitry in the semiconductor package 100.

As shown in FIG. 1B, the semiconductor package 100 may initially dispose (or form) the POINT assembly/architecture, and subsequently implement the bridge and die bonding (or the bridge to die bonding). For example, the semiconductor package 100 may couple (or attach) the patches 120-121 to the interposer 102, and dispose (or add) the underfill encapsulation material layers 130 below and between the patches 120-121, while leaving the cutout of the cavity 125 between the patches 120-121 for the bridge and die bonding. Then, in some embodiments, the semiconductor package 100 may dispose the bridge 140 into the cavity 125, and the dies 150-151 over the bridge 140 and the patches 120-121, where a thermal compression bonding may be implemented for the bridge to die bonding, and the underfill encapsulation material layers 130 may then be disposed (or added) between the dies 150-151 and the top surfaces of the bridge 140, the patches 120-121, and the RDL (or build-up layers).

Note that the semiconductor package 100 of FIGS. 1A-1B may include fewer or additional packaging components and build-up layers based on the desired packaging design.

Referring now to FIG. 2, a cross-sectional illustration of a semiconductor package 200 is shown, in accordance with an embodiment. The semiconductor package 200 may be substantially similar to the semiconductor package 100 of FIGS. 1A-1B, with the exception that a substrate 270 is used to couple the dies 250-251 and the patches 220-221. Whereas a bridge 140 is disposed in a cavity 125 formed between patches 120-121 in FIG. 1A, the substrate 270 is disposed (or sandwiched) between the dies 250-251 and the patches 220-221 in FIG. 2. While one substrate 270 and two dies 250-251 are illustrated, it is to be appreciated that any number of substrates 270 and dies 250-251 may be positioned on/over/in the patches 220-221.

In one embodiment, the substrate 270 may be disposed on the patches 220-221, while the dies 250-251 may be disposed on the substrate 270. In an embodiment, the substrate 270 may be coupled to the dies 250-251 and the patches 220-221 with the second solder balls 264. Similar to the package above, the semiconductor package 200 may include the patches 220-221 disposed on the interposer 202. The patches 220-221 may be coupled to the interposer 202 with the first solder balls 262. In an embodiment, the underfill material 254 may surround the first solder balls 262 below the patches 220-221, and the second solder balls 264 below the dies 250-251 and the substrate 270; and, additionally, the underfill material 254 may be disposed between the patches 220-221.

In one embodiment, the substrate 270 may be a HDP substrate. The HDP substrate 270 may be a silicon substrate having increased (or high) input/output (I/O) density and bandwidth for the communication between the dies 250-251 and the patches 220-221 of the semiconductor package 200. The HDP substrate 270 may include high-density solder bumps and fine conductive traces that create high-density interconnects between the dies 250-251 and the patches 220-221. In one embodiment, the substrate 270 may have a thickness of approximately 10 µm to 200 µm.

In an embodiment, the patches 220-221 may be communicatively coupled by the substrate 270. In some embodiments, the substrate 270 may also communicatively couple the die 250 to the die 251. In an embodiment, the dies 250-251 are both active dies (i.e., the die 250 and the die 251 may each comprise active devices, such as transistors or the like). In an embodiment, the dies 250-251 may include active device at a processing node. In a particular embodiment, the processing node is an advanced node (i.e., the node has smaller transistor gate lengths). However, it is to be appreciated that the node may be any processing node.

Note that the semiconductor package 200 may include fewer or additional packaging components based on the desired packaging design.

Referring now to FIG. 3, a cross-sectional illustration of a semiconductor package 300 is shown, in accordance with an embodiment. The semiconductor package 300 may be substantially similar to the semiconductor packages 100 and 200 of FIGS. 1A-2, with the exception that a substrate 370 is used to couple the patches 320-221 and the interposer 302. Whereas a substrate 270 is disposed on patches 220-221 in FIG. 2, the substrate 370 is disposed (or sandwiched) between the patches 220-221 and the interposer 302 in FIG. 3 to improve the overall coplanarity of the semiconductor package 300 (i.e., as the substrate 370 is below the patches 320-321, any mismatch between the thicknesses of the patches 320-321 may not impact the package coplanarity for the assembly of the dies 350-351 and patches 320-321). While one substrate 370 and two dies 350-351 are illustrated, it is to be appreciated that any number of substrates 370 and dies 350-351 may be positioned on/over/in/below the patches 320-321.

As shown in FIG. 3, in one embodiment, the substrate 370 may be disposed on the interposer 302, while the patches 320-321 may be disposed on the interposer 302. For one embodiment, the dies 350-351 may be disposed on the patches 320-321. For example, the die 350 may be disposed directly above the patch 320, and the die 351 may be disposed directly above the patch 321. The dies 350-351 may be coupled to the patches 320-321 with the third solder balls 364.

In an embodiment, the substrate 370 may be coupled to the interposer 302 with the first solder balls 360, and the patches 320-321 may be coupled to the substrate 370 with the second solder balls 362. In one embodiment, the underfill material 354 may surround the first solder balls 360 below the substrate 370, the second solder balls 362 below the patches 320-321, and the third solder balls 364 below the dies 350-351; and, additionally, the underfill material 354 may be disposed between the patches 320-321.

In one embodiment, the substrate 370 may be a HDP substrate. The substrate 370 may be substantially similar to the substrate 270 of FIG. 2. In a particular embodiment, the substrate 370 may have a thickness that is approximately 10 µm to 200 µm. In an embodiment, the patches 320-321 may be communicatively coupled by the substrate 370. In some embodiments, the substrate 370 may also communicatively couple the die 350 to the die 351. In an embodiment, the dies 350-351 are both active dies (i.e., the die 350 and the die 351 may each comprise active devices, such as transistors or the like). In an embodiment, the dies 350-351 may include active device at a processing node. In a particular embodiment, the processing node is an advanced node (i.e., the node has smaller transistor gate lengths). However, it is to be appreciated that the node may be any processing node.

Note that the semiconductor package 300 may include fewer or additional packaging components based on the desired packaging design.

Referring now to FIG. 4, a cross-sectional illustration of a semiconductor package 400 is shown, in accordance with an embodiment. The semiconductor package 400 may be substantially similar to the semiconductor packages 200 of FIG. 2, with the exception that an encapsulation layer 480 may be disposed around and over the patches 420-421. Whereas a substrate 270 with solder balls 264 is disposed directly on patches 220-221 in FIG. 2, the substrate 470 with the solder balls 464 is disposed directly on the encapsulation layer 480 that slightly covers one or more surfaces of the patches 420-421 in FIG. 4 to improve the overall coplanarity of the semiconductor package 400 (i.e., any mismatch between the thicknesses of the patches 420-421 may be offset by the encapsulation layer process 480 over the patches 420-421). While one substrate 470 and two dies 450-451 are illustrated, it is to be appreciated that any number of substrates 470 and dies 450-451 may be positioned on/over/in/below the patches 420-421. Note that, as described in FIGS. 4-8B, a "substrate" may refer to a HDP substrate 470. However, in another embodiment, a "substrate" may refer to an embedded bridge 540 and 740 of FIGS. 5-8B.

In one embodiment, the encapsulation layer 480 may be a mold layer and/or any similar encapsulation material(s). For one embodiment, the encapsulation layer 480 may include an epoxy (e.g., a soft epoxy, a stiff epoxy, opaque epoxy, etc.) with one or more filler materials. In an embodiment, the encapsulation layer 480 may be compression molded, laminated, or the like. In an embodiment, the encapsulation layer 480 may be disposed over the one or more surfaces (or bottom surfaces) of the patches 420-421, and subsequently planarized—for example, while placed on a flat carrier with the top side down as the carrier may be any flat surface, glass, organic, etc.—to be substantially parallel to a bottom surface of the substrate 470 (e.g., with a CMP process or the like).

Additionally, as shown in FIG. 4, the encapsulation layer 480 may surround (or embed) the patches 420-421 by disposing the encapsulation layer 480 over, below and between the patches 420-421, and around the outer edges of the patches 420-421. In one embodiment, the top surface of the encapsulation layer 480 may be positioned below both the bottom surfaces of the patches 420-421. In another embodiment, the top surface of the encapsulation layer 480 may be substantially coplanar to the top surfaces of the patches 420-421.

In one embodiment, the substrate 470 may be disposed on the patches 420-421, while the dies 450-451 may be disposed on the substrate 470. In an embodiment, the substrate 470 may be coupled to the dies 450-451 and the patches 420-421 with the second solder balls 464. Similar to the packages above, the semiconductor package 400 may include the patches 420-421 disposed on the interposer 402. The patches 420-421 may be coupled to the interposer 402 with the first solder balls 462. In an embodiment, the underfill material 454 may surround a portion of the first solder balls 462 below the patches 420-421, as the underfill material 454 is disposed between the encapsulation layer 480 below the patches 420-421 and the interposer 402. For one embodiment, the underfill material may surround the second solder balls 464 below the dies 450-451 and the substrate 470, where the underfill material 454 may be disposed between the encapsulation layer 480 above the patches 420-421 and the bottom surface of the substrate 470.

In one embodiment, the substrate 470 may be a HDP substrate. In one embodiment, the substrate 470 may have a thickness of approximately 10 µm to 200 µm. In an embodiment, the patches 420-421 may be communicatively coupled by the substrate 470. In some embodiments, the substrate 470 may also communicatively couple the die 450 to the die 451. In an embodiment, the dies 450-451 are both active dies (i.e., the die 450 and the die 451 may each comprise active devices, such as transistors or the like). In an embodiment, the dies 450-451 may include active device at a processing node. In a particular embodiment, the processing node is an advanced node (i.e., the node has smaller transistor gate lengths). However, it is to be appreciated that the node may be any processing node.

Note that the semiconductor package 400 may include fewer or additional packaging components based on the desired packaging design.

Referring now to FIG. 5, a cross-sectional illustration of a semiconductor package 500 is shown, in accordance with an embodiment. The semiconductor package 500 may be substantially similar to the semiconductor package 100 of FIGS. 1A-1B, with the exception that an encapsulation layer 580 may be disposed around and in between the patches 520-521 (e.g., a cavity may be formed first, and then a bridge may be attached, as the RDL layers may be formed after encapsulation). Whereas a filler material 130 is disposed between patches 120-121 in FIG. 1, the encapsulation layer 580 is disposed between and around the patches 520-521 in FIG. 5 to improve the overall coplanarity on the top surfaces of the patches 520-521, while the use of a bridge 540 instead of a separate HDP substrate with solder balls helps to reduce the signal loss of the semiconductor package 500 (i.e., any mismatch between the thicknesses of the patches 520-521 may be offset by the combination of the encapsulation layer 580 and the build-up layers 530 over the patches 520-521; and, by not having a substrate between the patches 520-521 and the dies 550-551, the signal between the patches 520-521 and the dies 550-551 is improved). While one bridge 540 and two dies 550-551 are illustrated, it is to be appreciated that any number of bridges 540 and dies 550-551 may be positioned on/over/in the patches 520-521.

Similar to the packages above, the semiconductor package 500 may include the patches 520-521 disposed on the interposer 502. The patches 520-521 may be coupled to the interposer 502 with the first solder balls 562. In an embodiment, the underfill material 554 may surround a portion of the first solder balls 562 below the patches 520-521, as the underfill material 554 is disposed between the encapsulation layer 580 below the patches 520-521 and the interposer 502. For one embodiment, the underfill material 554 may surround the second solder balls 564 below the dies 550-551, where the underfill material 554 may be disposed between the top surface of the build-up layers 530 and the bottom surfaces of the dies 550-551.

Additionally, the encapsulation layer 580 may surround the patches 520-521 by disposing the encapsulation layer below and between the patches 520-521, and around the outer edges of the patches 520-521. In one embodiment, the top surface of the encapsulation layer 580 may be positioned below both of the bottom surfaces of the patches 520-521. In another embodiment, the encapsulation layer 580 may enable the top surfaces of the patches 520-521 to be substantially coplanar to one another.

As shown in FIG. 5, the patches 520-521 may have a cavity 525 that surrounds (or embeds) the bridge 540. In an embodiment, the patches 520-521 may be communicatively coupled by the bridge 540. In an embodiment, the bridge 540 may communicatively couple the patch 520 to the patch 521, and/or the die 550 to the die 551. In an embodiment, the bridge 540 may be coupled to the patches 520-521 by an adhesive layer 510. In an embodiment, the bridge 540 allows for the combined area of a plurality of dies 550-551 to be greater than the reticle limit used to form active devices on the dies 550-551.

In an embodiment, the bridge 540 may be disposed in the cavity 525 between the patches 520-521, and embedded within a plurality of build-up layers 530 in the cavity 525. In one embodiment, the cavity 525 may have a thickness that is approximately equal to a thickness of the bridge 540 with the adhesive layer 510. In another embodiment, the cavity 525 may have a thickness that is approximately equal to a thickness of the bridge 540 with the adhesive layer 510.

In an embodiment, the build-up layers 530 may be disposed over the patches 520-521, the bridge 540, and the encapsulation layer 580. For example, the build-up layers 530 may surround (or embed) the bridge 540 with the adhesive layer 510. In one embodiment, the build-up layers 530 may have a first thickness and a second thickness. The first thickness may be defined as the thickness between the top surfaces of the patches 520-521 and the bridge 540, and the underfill material 554 below the dies 550-551. The second thickness may be defined as the thickness between the bottom surface of the cavity 525 (i.e., the top corner/edge surfaces within the cavity 525 of the patches 520-521) and the underfill material 554 below the dies 550-551. For one embodiment, the first thickness of the build-up layers 530 is less than the second thickness of the build-up layers 530. In one embodiment, the build-up layers 530 may include interconnect structures (e.g., as shown with the conductive traces 511-514, the vias 531-533, and the dielectrics 530 of FIGS. 6A-6B) that electrically couple the dies 550-551 disposed over the patches 520-521 to the bridge 540, the interposer 502, and any other components and/or circuitry in the semiconductor package 500.

For one embodiment, the build-up layers 530 may include a plurality of dielectrics. In an embodiment, the dies 550-551 may be disposed over the bridge 540 and the patches 520-521. For example, each of the dies 550-551 may have an outer edge that is positioned over the bridge 540. In an embodiment, the dies 550-551 may be electrically coupled to the bridge 540 and the patches 520-521 with the second solder balls 564 and FLI 514 (as shown in FIG. 6B).

In an embodiment, the dies 550-551 are both active dies (i.e., the die 550 and the die 551 may each comprise active devices, such as transistors or the like). In an embodiment, the dies 550-551 may include active device at a processing node. In a particular embodiment, the processing node is an advanced node (i.e., the node has smaller transistor gate lengths However, it is to be appreciated that the node may be any processing node.

Note that the semiconductor package 500 may include fewer or additional packaging components based on the desired packaging design.

Figure 6A:
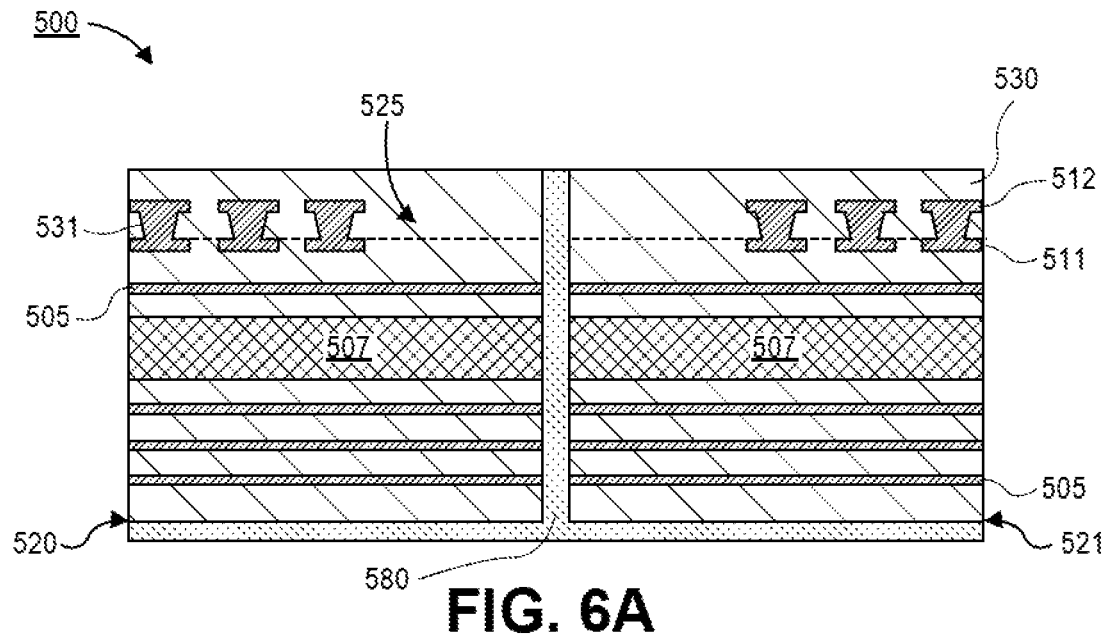
FIGS. 6A-6B are detailed illustrations of cross-sectional views of a semiconductor package with a plurality of patches, a bridge in a cavity, an encapsulation layer, and a plurality of build-up layers, according to some embodiments.
Figure 6B:
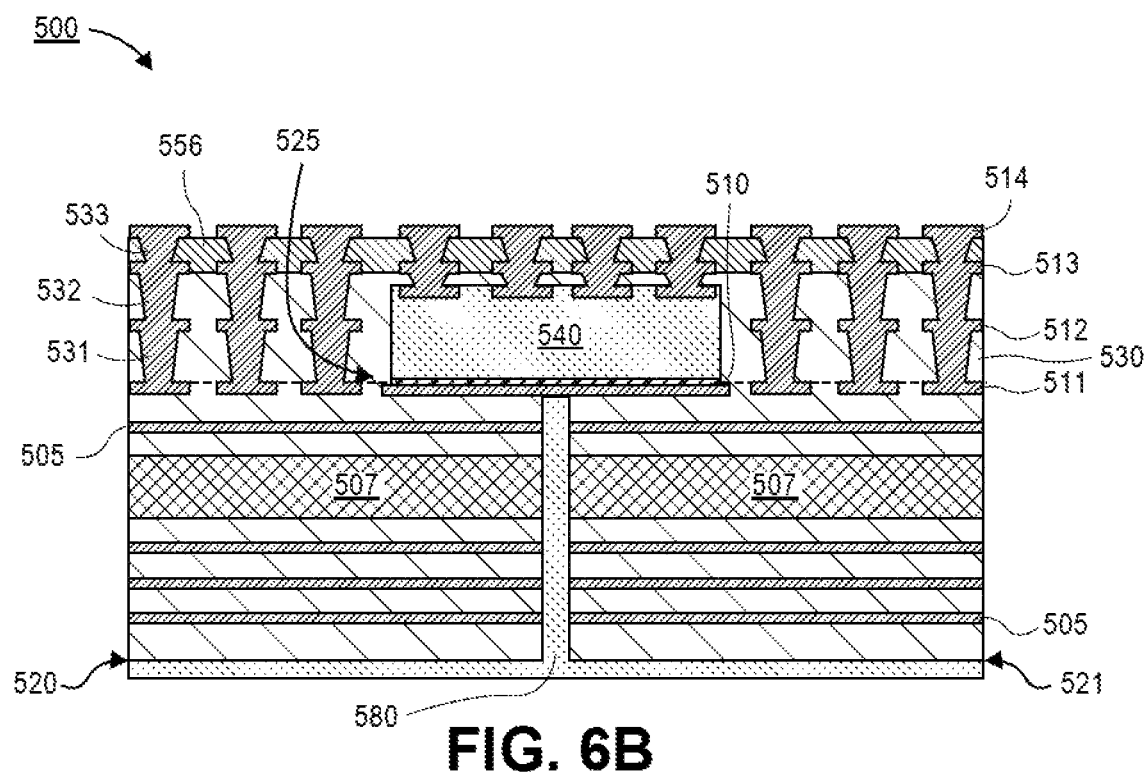

Referring now to FIGS. 6A-6B, a series of cross-sectional illustrations illustrating a process for forming the bridge 540 and the build-up layers 530 of the semiconductor package 500 described above with respect to FIG. 5 is shown, in accordance with an embodiment.

Referring now to FIG. 6A, a detailed cross-sectional illustration of a portion of the build-up layers 530 is shown, as the cavity 525 above the patches 520-521 is shown prior to disposing the bridge into the cavity 525, according to one embodiment. In an embodiment, as shown in FIG. 5, the dies 550-551 may be disposed over a RDL which may be formed over the patches 520-521. The illustrated RDL is shown as having a dielectric build-up layer for simplicity, and those skilled in the art will recognize that the RDL may include a plurality of build-up layers. The RDL may also include a conductive layer, which may include a plurality of conductive traces 511-512 and vias 531, as is known in the art. In one embodiment, as described above, the patches 520-521 may include a core layer 507, and alternating layers of organic build-up layers 530 and conductive routing layers 505, as is known in the art.

Referring now to FIG. 6B, a detailed cross-sectional illustration of a portion of the build-up layers 530 is shown, after the bridge 540 and the remaining conductive layers 511-514 and vias 531-534 are disposed in the build-up layers 530, according to one embodiment. In one embodiment, the build-up layers 530 may include disposing the bridge 540 with the adhesive layer 510 on the top outer edges of the patches 520-521 within the cavity 525. For one embodiment, the build-up layers 530 may also include disposing (or forming) the conductive routing layers, such as the traces 511-514 and the vias 531-533, over the patches 520-521 and the bridge 540. For example, the build-up layers 530 may communicatively couple the patches 520-521 to the dies 550-551 (as shown in FIG. 5). In an embodiment, the traces 511-514 and the vias 531-533 may electrically couple the FLIs 514 over the patches 520-521 and the bridge 540 to the dies 550-551 and other components and/or circuitry in the semiconductor package 500.

Note that the semiconductor package 500 of FIGS. 6A-6B may include fewer or additional packaging components based on the desired packaging design.

Figure 7:
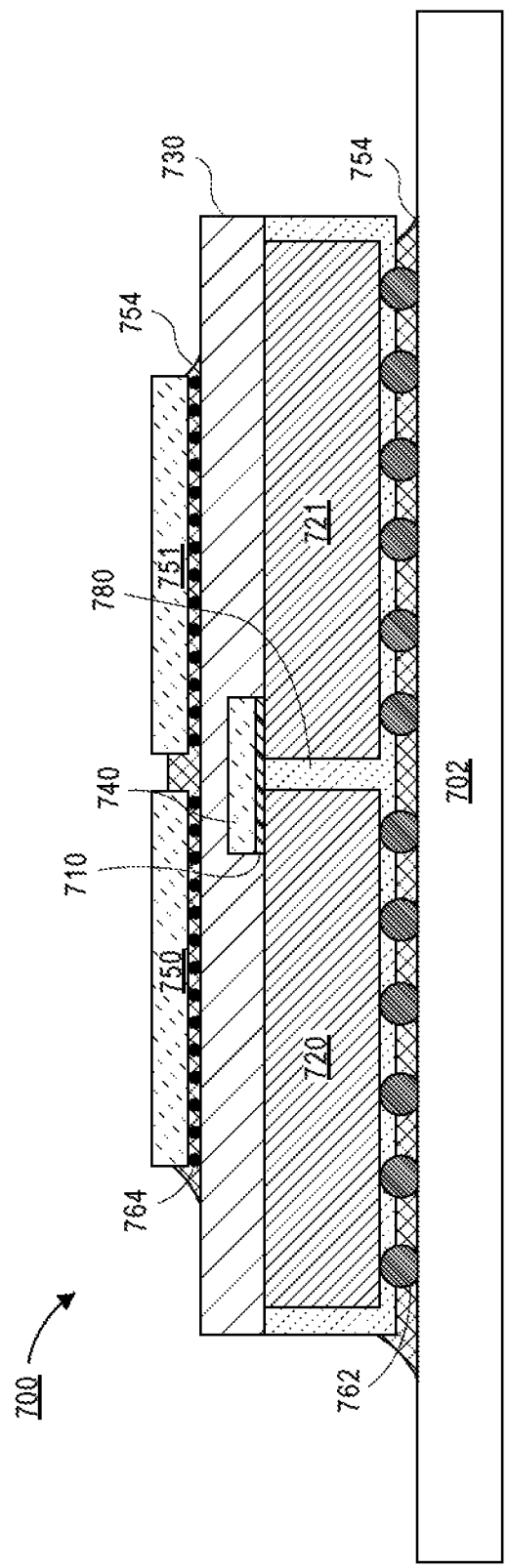
FIG. 7 is an illustration of a cross-sectional view of a semiconductor package with a plurality of dies, a plurality of patches, a bridge, an encapsulation layer, a plurality of build-up layers, and an interposer, according to one embodiment.

Referring now to FIG. 7, a cross-sectional illustration of a semiconductor package 700 is shown, in accordance with an embodiment. The semiconductor package 700 may be substantially similar to the semiconductor package 500 of FIGS. 5-6B, with the exception that a bridge 740 is embedded in build-up layers 730 and disposed on patches 720-721 without a cavity between the patches 720-721. Whereas a bridge 540 is disposed in a cavity 525 formed between patches 520-521 in FIGS. 5-6B, the bridge 740 with the adhesive film 710 is disposed directly on the top corner edges of the patches 720-721 in FIG. 7 to improve the overall coplanarity and reduce the signal loss of the semiconductor package 700 by avoiding the requirement of a patch-to-die connection with a separate HDP substrate and additional solder ball connections. While one bridge 740 and two dies 750-751 are illustrated, it is to be appreciated that any number of bridges 740 and dies 750-751 may be positioned on/over/in the patches 720-721.

Similar to the packages above, the semiconductor package 700 may include the patches 720-721 disposed on the interposer 702. The patches 720-721 may be coupled to the interposer 702 with the first solder balls 762. In an embodiment, the underfill material 754 may surround a portion of the first solder balls 762 below the patches 720-721, as the underfill material 754 is disposed between the encapsulation layer 780 below the patches 720-721 and the interposer 702. For one embodiment, the underfill material may surround the second solder balls 764 below the dies 750-751, where the underfill material 754 may be disposed between the top surface of the build-up layers 730 and the bottom surfaces of the dies 750-751.

Additionally, the encapsulation layer 780 may surround the patches 720-721 by disposing the encapsulation layer below and between the patches 720-721, and around the outer edges of the patches 720-721. In one embodiment, the top surface of the encapsulation layer 780 may be positioned below one of the bottom surfaces of the patches 720-721. In another embodiment, the encapsulation layer 780 allows the patches 720-721 to have surfaces that may be substantially coplanar to each other.

As shown in FIG. 7, the bridge 740 may be disposed on the top corner/outer edges of the patches 720-721. In an embodiment, the patches 720-721 may be communicatively coupled by the bridge 740. In an embodiment, the bridge 740 may communicatively couple the patch 720 to the patch 721, and/or the die 750 to the die 751. In an embodiment, the bridge 740 may be coupled to the patches 720-721 by the adhesive layer 710. In an embodiment, the bridge 740 allows for the combined area of a plurality of dies 750-751 to be greater than the reticle limit used to form active devices on the dies 750-751.

In an embodiment, the bridge 740 may be embedded within the plurality of build-up layers 730. In one embodiment, the build-up layers 730 may have a first thickness and a second thickness. The first thickness may be defined as the thickness between the top surfaces of the patches 720-721 and the underfill material 754 below the dies 750-751. The second thickness may be defined as the thickness between the top surface of the bridge 740 and the underfill material 754 below the dies 750-751. For one embodiment, the first thickness of the build-up layers 730 is greater than the second thickness of the build-up layers 730.

In an embodiment, the build-up layers 730 may be disposed over the patches 720-721, the bridge 740, and the encapsulation layer 780. For example, the build-up layers 730 may embed/surround the bridge 740 with the adhesive layer 710. In one embodiment, the build-up layers 730 may include interconnect structures (e.g., as shown with the conductive traces 711-716, the vias 731-735, and the dielectrics 730 of FIGS. 8A-8B) that electrically couple the dies 750-751 disposed over the patches 720-721 to the bridge 740, the interposer 702, and any other components and/or circuitry in the semiconductor package 700.

For one embodiment, the build-up layers 730 may include a plurality of dielectrics. In an embodiment, the dies 750-751 may be disposed over the bridge 740 and the patches 720-721. For example, each of the dies 750-751 may have an outer edge that is positioned over the bridge 740. In an embodiment, the dies 750-751 may be electrically coupled to the bridge 740 and the patches 720-721 with the second solder balls 764 and FLI 716 (as shown in FIG. 8B).

In an embodiment, the dies 750-751 are both active dies (i.e., the die 750 and the die 751 may each comprise active devices, such as transistors or the like). In an embodiment, the dies 750-751 may include active device at a processing node. In a particular embodiment, the processing node is an advanced node (i.e., the node has smaller transistor gate lengths). However, it is to be appreciated that the node may be any processing node.

Note that the semiconductor package 700 may include fewer or additional packaging components based on the desired packaging design.

Figure 8A:
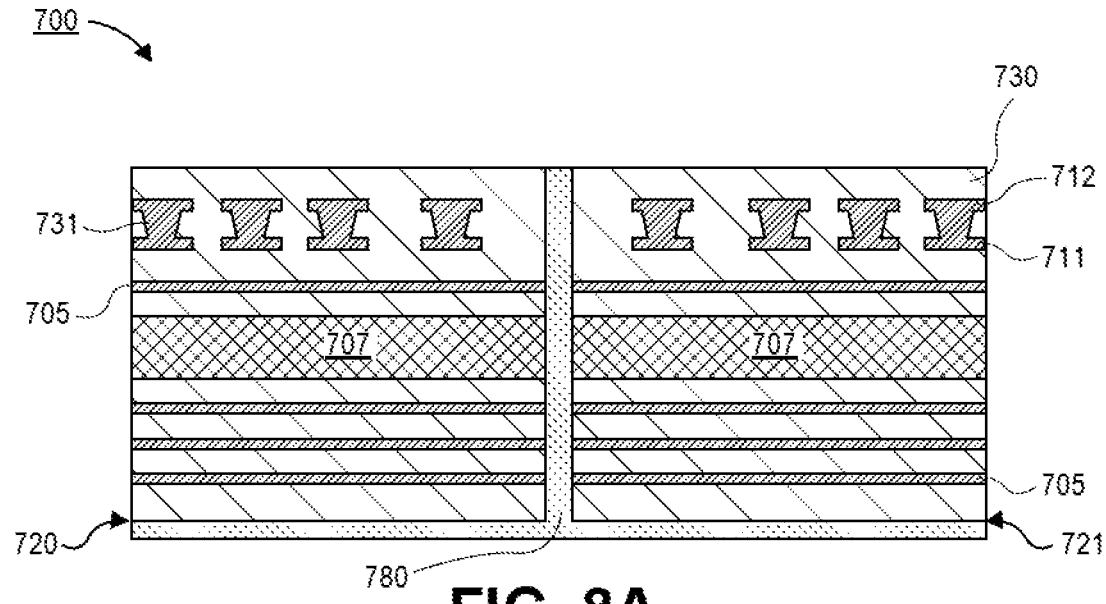
FIGS. 8A-8B are detailed illustrations of cross-sectional views of a semiconductor package with a plurality of patches, a bridge, an encapsulation layer, and a plurality of build-up layers, according to some embodiments.
Figure 8B:
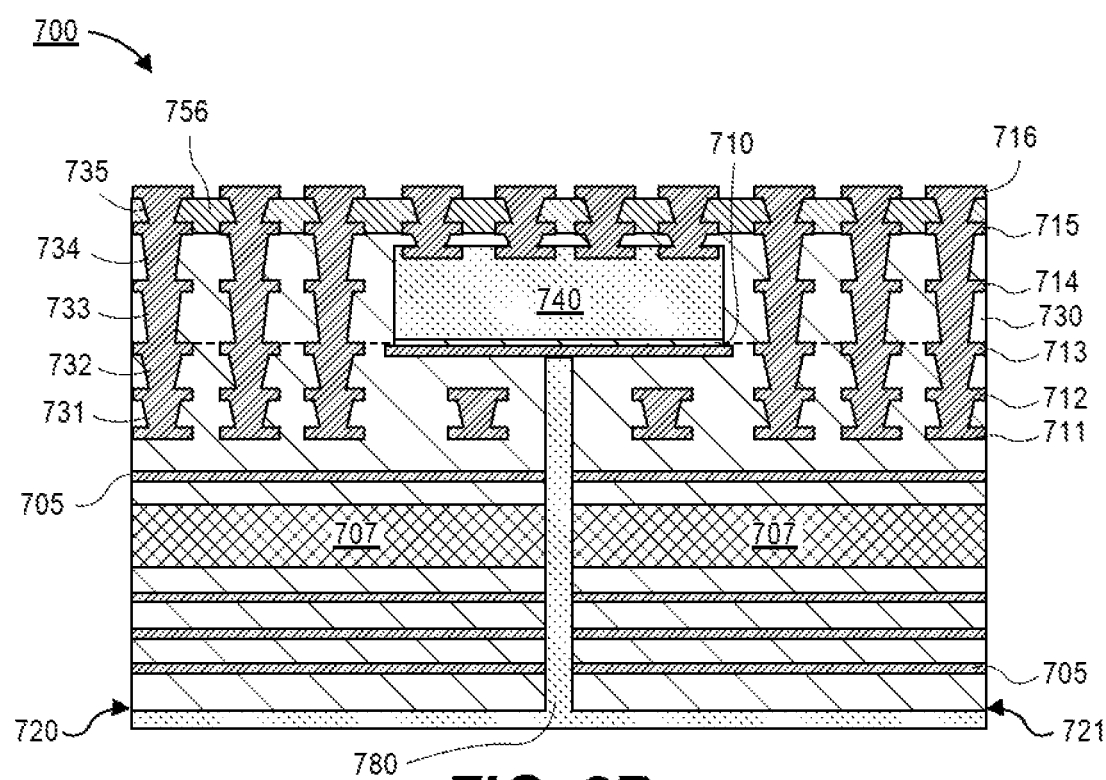

Referring now to FIGS. 8A-8B, a series of cross-sectional illustrations illustrating a process for forming the bridge 740 and the build-up layers 730 of the semiconductor package 700 described above with respect to FIG. 7 is shown, in accordance with an embodiment.

Referring now to FIG. 8A, a detailed cross-sectional illustration of a portion of the build-up layers 730 is shown, prior to disposing the bridge over the patches 720-721, according to one embodiment. In an embodiment, as shown in FIG. 7, the dies 750-751 may be disposed over a RDL. The illustrated RDL is shown as having a single dielectric build-up layer 730 for simplicity, and those skilled in the art will recognize that the RDL may include a plurality of build-up layers 730. The RDL may also include a conductive layer, which may include a plurality of conductive traces 711-712 and vias 731, as is known in the art. In one embodiment, as described above, the patches 720-721 may include a core layer 707, and alternating layers of organic build-up layers 730 and conductive routing layers 705, as is known in the art.

Referring now to FIG. 8B, a detailed cross-sectional illustration of a portion of the build-up layers 730 is shown, after the bridge 740 and the remaining conductive layers 711-716 and vias 731-735 are disposed in the build-up layers 730, according to one embodiment. In one embodiment, the build-up layers 730 may include disposing the bridge 740 with the adhesive layer 710 on the top outer edges of the patches 720-721. For one embodiment, the build-up layers 730 may also include disposing (or forming) the conductive routing layers, such as the traces 711-716 and the vias 731-735, over the patches 720-721 and the bridge 740. For example, the build-up layers 730 may communicatively couple the patches 720-721 to the dies 750-751 (as shown in FIG. 7). In an embodiment, the traces 711-716 and the vias 731-735 may electrically couple the FLIs 716 over the patches 720-721 and the bridge 740 to the dies 750-751 and other components and/or circuitry in the semiconductor package 700.

Note that the semiconductor package 700 of FIGS. 8A-8B may include fewer or additional packaging components based on the desired packaging design.

Referring now to FIG. 9, a cross-sectional illustration of a semiconductor package 900 is shown, in accordance with an embodiment. The semiconductor package 900 may be substantially similar to the semiconductor package 700 of FIGS. 7-8B, with the exception that a bridge 940 is disposed over build-up layers 930 and a plurality of bridges 941-942 (i.e., the embedded bridges 941-942) are embedded in patches 920-921, respectively. Whereas a bridge 740 is disposed directly on the top corner edges/surfaces of the patches 720-721 in FIGS. 7-8B, the bridges 940-942 are disposed on the build-up layers 930 and/or embedded in the patches 920-921 in FIG. 9 to (i) provide a simpler process flow as compared to the process flow needed to implement the semiconductor package 700 described above in FIG. 7, and (ii) enable separately testing of the patches 920-921 prior to disposing the encapsulation layer 980. While three bridges 940-942 and two dies 950-951 are illustrated, it is to be appreciated that any number of bridges 940-942 and dies 950-951 may be positioned on/over/in the patches 920-921. Note that, as described in FIGS. 9-11C, a "substrate" may refer to the embedded bridges 941-942 and the embedded substrates 1070-1071 of FIG. 10.

Similar to the packages above, the semiconductor package 900 may include the patches 920-921 disposed on the interposer 902. The patches 920-921 may be coupled to the interposer 902 with the first solder balls 962. In an embodiment, the underfill material 954 may surround a portion of the first solder balls 962 below the patches 920-921, as the underfill material 954 is disposed between the encapsulation layer 980 below the patches 920-921 and the interposer 902. For one embodiment, the underfill material may surround the second solder balls 964 below the bridge 940 and the dies 950-951, where the underfill material 954 may be disposed between the top surface of the build-up layers 930 and the bottom surfaces of the bridge 940 and dies 950-951.

Additionally, the encapsulation layer 980 may surround the patches 920-921 by disposing the encapsulation layer below and between the patches 920-921, and around the outer edges of the patches 920-921. In one embodiment, the top surface of the encapsulation layer 980 may be positioned below the bottom surfaces of the patches 920-921. In another embodiment, the encapsulation layer 980 allows the patches 920-921 to have surfaces that may be substantially coplanar to each other.

As shown in FIG. 9, according to one embodiment, the bridge 940 may be disposed over the build-up layers 930 and the patches 920-921, and the bridges 940-942 may be embedded within the patches 920-921, respectively. The bridge 940 may be disposed directly on the top surface of the build-up layers 930. In one embodiment, the bridge 940 may be disposed between the dies 950-951, where the top surface of the bridge 940 may be substantially coplanar to the top surfaces of the dies 950-951. Furthermore, the bridge 941 may be embedded and positioned within a corner portion/area of the patch 920, and the bridge 942 may be embedded and positioned within a corner portion/area of the patch 921.

For some embodiments, the embedded bridges 941-942 may provide high-routing interconnects in the patches 920-921, while the bridge 940 may enable coupling the patch 920 to the patch 921. In an embodiment, the bridge 940 may be coupled to the build-up layers 930 and the patches 920-921 by the second solder balls 964. The bridge 940 may be positioned above the encapsulation layer 980 between the patches 920-921.

In one embodiment, the build-up layers 930 may be disposed from the top surfaces of the patches 920-921 and encapsulation layer 980 to the bottom surface of the underfill material 954. In an embodiment, the build-up layers 930 may be disposed over the patches 920-921, the bridges 941-942, and the encapsulation layer 980. In one embodiment, the build-up layers 930 may include interconnect structures (e.g., as shown with the conductive traces 911-913, the vias 931-932, and the dielectrics 930 of FIGS. 11A-11C) that electrically couple the dies 950-951 and the bridge 940 to the bridges 941-942, the patches 920-921, the interposer 902, and any other components and/or circuitry in the semiconductor package 900. For one embodiment, the build-up layers 930 may include a plurality of dielectrics.

In an embodiment, the dies 950-951 may be disposed over the build-up layers 930. In an embodiment, the dies 950-951 may be electrically coupled to the bridge 940, the bridges 941-942, and the patches 920-921 with the second solder balls 964 and FLI 913 (as shown in FIG. 11C). In an embodiment, the dies 950-951 are both active dies (i.e., the die 950 and the die 951 may each comprise active devices, such as transistors or the like). In an embodiment, the dies 950-951 may include active device at a processing node. In a particular embodiment, the processing node is an advanced node (i.e., the node has smaller transistor gate lengths). However, it is to be appreciated that the node may be any processing node.

Note that the semiconductor package 900 may include fewer or additional packaging components based on the desired packaging design.

Referring now to FIG. 10, a cross-sectional illustration of a semiconductor package 1000 is shown, in accordance with an embodiment. The semiconductor package 1000 may be substantially similar to the semiconductor package 900 of FIG. 9, with the exception that a bridge 1040 is disposed over build-up layers 1030 and a plurality of substrates 1070-1071 are embedded in patches 1020-1021, respectively. Whereas bridges 941-942 are embedded in patches 920-921 in FIG. 9, the substrates 1070-1071 are embedded in the top portions of the patches 1020-1021 in FIG. 10 to (i) provide high-routing interconnects within the patches 1020-1021 and fewer build-up layers 1030, and (ii) enable separately testing of the patches 1020-1021 and the substrates 1070-1071 prior to disposing the encapsulation layer 1080. While one bridge 1040, two substrates 1070-1071, and two dies 1050-1051 are illustrated, it is to be appreciated that any number of bridges 1040, substrates 1070-1071, and dies 1050-1051 may be positioned on/over/in/below the patches 1020-1021. Note that, as described in FIGS. 9-11C, a "substrate" may refer to the embedded bridges 941-942 of FIGS. 9 and 11A-11C and the embedded substrates 1070-1071.

Similar to the packages above, the semiconductor package 1000 may include the patches 1020-1021 disposed on the interposer 1002. The patches 1020-1021 may be coupled to the interposer 1002 with the first solder balls 1062. In an embodiment, the underfill material 1054 may surround a portion of the first solder balls 1062 below the patches 1020-1021, as the underfill material 1054 is disposed between the encapsulation layer 1080 below the patches 1020-1021 and the interposer 1002. For one embodiment, the underfill material may surround the second solder balls 1064 below the bridge 1040 and the dies 1050-1051, where the underfill material 1054 may be disposed between the top surface of the build-up layers 1030 and the bottom surfaces of the bridge 1040 and dies 1050-1051.

Additionally, the encapsulation layer 1080 may surround the patches 1020-1021 and the substrates 1070-1071 by disposing the encapsulation layer below and between the patches 1020-1021 and substrates 1070-1071, and around the outer edges of the patches 1020-1021 and substrates 1070-1071. In one embodiment, the top surface of the encapsulation layer 1080 may be positioned below the bottom surfaces of the substrates 1070-1071. In another embodiment, the encapsulation layer 1080 allows the patches 1020-1021 to have surfaces that may be substantially coplanar to each other.

As shown in FIG. 10, according to one embodiment, the bridge 1040 may be disposed over the build-up layers 1030 and the patches 1020-1021, and the substrates 1070-1071 may be embedded within the patches 1020-1021, respectively. The bridge 1040 may be disposed directly on the top surface of the build-up layers 1030. In one embodiment, the bridge 1040 may be disposed between the dies 1050-1051, where the top surface of the bridge 1040 may be substantially coplanar to the top surfaces of the dies 1050-1051. Furthermore, the substrate 1070 may be embedded and positioned within a top portion/area of the patch 1020, and the substrate 1071 may be embedded and positioned within a top portion/area of the patch 1021.

For some embodiments, the embedded substrates 1070-1071 may provide high-routing interconnects in the patches 1020-1021, while the bridge 1040 may enable coupling the patch 1020 to the patch 1021. In an embodiment, the bridge 1040 may be coupled to the build-up layers 1030 and the patches 1020-1021 by the second solder balls 1064. The bridge 1040 may be positioned above the encapsulation layer 1080 between the patches 1020-1021. In one embodiment, the substrates 1070-1071 may be HDP substrates. In one embodiment, the substrates 1070-1071 may have a thickness of approximately 10 µm to 200 µm. In one embodiment, the substrate 1070 may have a thickness that is substantially equal to a thickness of the substrate 1071. In another embodiment, the substrate 1070 may have a thickness that is approximately equal to a thickness of the substrate 1071. In an embodiment, the substrates 1070-1071 may communicatively couple the patches 1020-1021, the bridge 1040, and/or the dies 1050-1051.

In one embodiment, the build-up layers 1030 may be disposed from the top surfaces of the substrates 1070-1071 in the patches 1020-1021 and encapsulation layer 1080 to the bottom surface of the underfill material 1054. In an embodiment, the build-up layers 1030 may be disposed over the substrates 1070-1071 in the patches 1020-1021 and the encapsulation layer 1080. In one embodiment, the build-up layers 1030 may include interconnect structures (e.g., as shown with the conductive traces 911-913, the vias 931-932, and the dielectrics 930 of FIGS. 11A-11C) that electrically couple the dies 1050-1051 and the bridge 1040 to the substrates 1070-1071, the patches 1020-1021, the interposer 1002, and any other components and/or circuitry in the semiconductor package 1000. For one embodiment, the build-up layers 1030 may include a plurality of dielectrics.

In an embodiment, the dies 1050-1051 may be disposed over the build-up layers 1030. In an embodiment, the dies 1050-1051 may be electrically coupled to the bridge 1040, the substrates 1070-1071, and the patches 1020-1021 with the second solder balls 1064. In an embodiment, the dies 1050-1051 are both active dies (i.e., the die 1050 and the die 1051 may each comprise active devices, such as transistors or the like). In an embodiment, the dies 1050-1051 may include active device at a processing node. In a particular embodiment, the processing node is an advanced node (i.e., the node has smaller transistor gate lengths). However, it is to be appreciated that the node may be any processing node.

Note that the semiconductor package 1000 may include fewer or additional packaging components based on the desired packaging design.

Figure 11A:
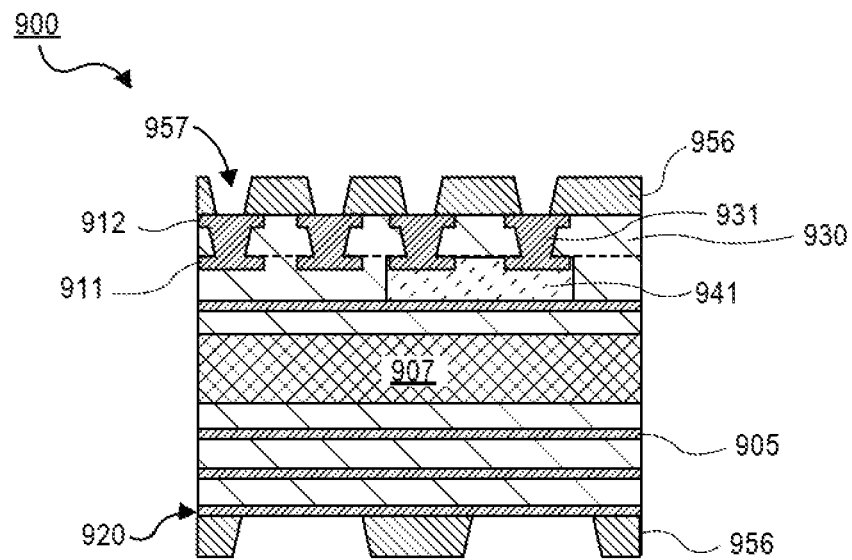
FIGS. 11A-11C are detailed illustrations of cross-sectional views of a semiconductor package with a plurality of dies, a plurality of patches, a plurality of bridges, an encapsulation layer, and a plurality of build-up layers, according to some embodiments.
Figure 11B:
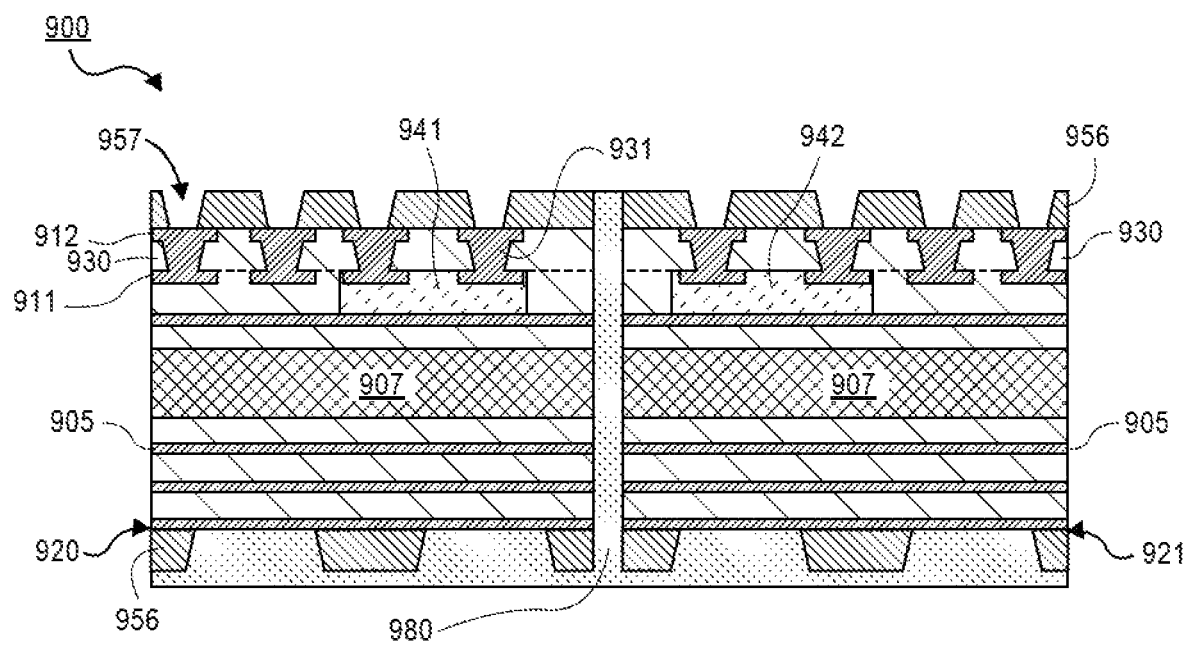
Figure 11C:
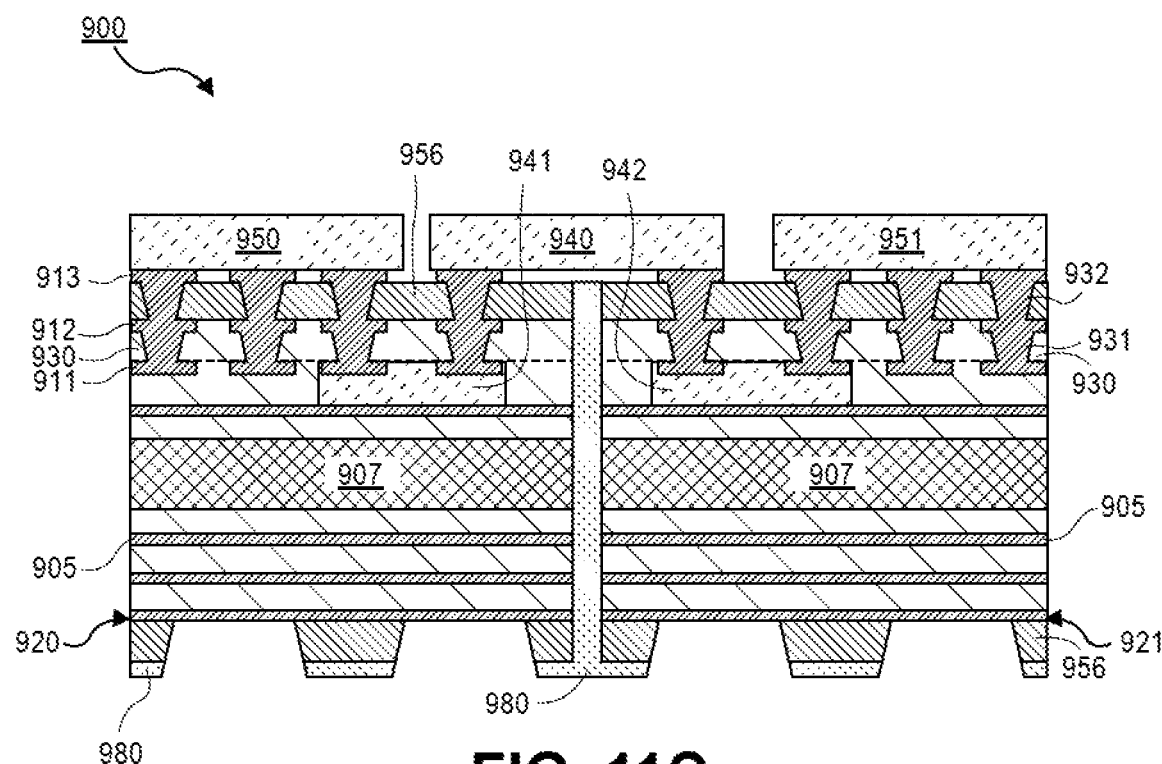

Referring now to FIGS. 11A-11C, a series of cross-sectional illustrations illustrating a process for forming the bridges 940-942 and the build-up layers 930 of the semiconductor package 900 described above with respect to FIG. 9 is shown, in accordance with an embodiment. Additionally, the process illustrated with FIGS. 11A-11C may also be implemented for forming the bridge 1040, the substrates 1070-1071, and the build-up layers 1030 of the semiconductor package 1000 described above with respect to FIG. 10, in accordance with an embodiment.

Referring now to FIG. 11A, a detailed cross-sectional illustration of a portion of the build-up layers 930 over the patch 920 is shown, prior to disposing the encapsulation layer, according to one embodiment. In an embodiment, as shown in FIG. 9, the illustrated RDL is shown as having a single dielectric build-up layer 930 for simplicity, and those skilled in the art will recognize that the RDL may include a plurality of build-up layers 930. The RDL may also include a conductive layer, which may include a plurality of conductive traces 911-912 and vias 931, as is known in the art.

In one embodiment, the patches 920-921 may include a core layer 907, a respective bridge 941-942, and alternating layers of organic build-up layers 930 and conductive routing layers 905, as is known in the art. For one embodiment, as shown in FIG. 11A, the patch 920 may include the embedded bridge 941, where the embedded bridge 941 may be coupled with the trace 911 to the subsequently formed FLIs 913 (as shown in FIG. 11C). In an embodiment, solder resist layers 956 may be disposed over the build-up layers 930 to provide isolation for the FLIs 913 (as shown in FIG. 11C) coupled to the dies and the bridge, and isolation for the SLIs coupled to the interposer. The solder resist layer 956 may be patterned with a plurality of openings 957 above the trace 912 to form the subsequent FLIs (as shown in FIG. 11C).

Referring now to FIG. 11B, a detailed cross-sectional illustration of a portion of the build-up layers 930 over the embedded bridges 941-942 and the patches 920-921 is shown, after the encapsulation layer 980 is disposed around and between the patches 920-921, according to one embodiment. In one embodiment, the encapsulation layer 980 may be disposed between the patches 920-921 and below the patches 920-921, where the encapsulation layer 980 may surround the solder resist layer 956 below the patches 920-921.

Referring now to FIG. 11C, a detailed cross-sectional illustration of a portion of the build-up layers 930 over the embedded bridges 941-942 and the patches 920-921 is shown, after the encapsulation layer 980 is patterned, and after the bridge 940, the dies 950-951, and the remaining conductive layers 911-913 and vias 931-932 are disposed over the build-up layers 930, according to one embodiment. In one embodiment, the bridge 940 may be disposed on the FLIs 913 to couple the bridge 941 to the bridge 942. Additionally, the dies 950-951 may be disposed on FLIs 913 to couple dies 950-951 to the bridges 941-942 and the patches 920-921, respectively.

For one embodiment, the build-up layers 930 may also include disposing (or forming) the conductive routing layers, such as the traces 911-913 and the vias 931-932, over the patches 920-921, the embedded bridges 941-942, and the encapsulation layer 980. In one embodiment, the build-up layers 930 may communicatively couple the patches 920-921 and the bridges 941-942 to the dies 950-951 and the bridge 940.

Note that the semiconductor package 900 of FIGS. 11A-11C may include fewer or additional packaging components based on the desired packaging design.

Figure 12:
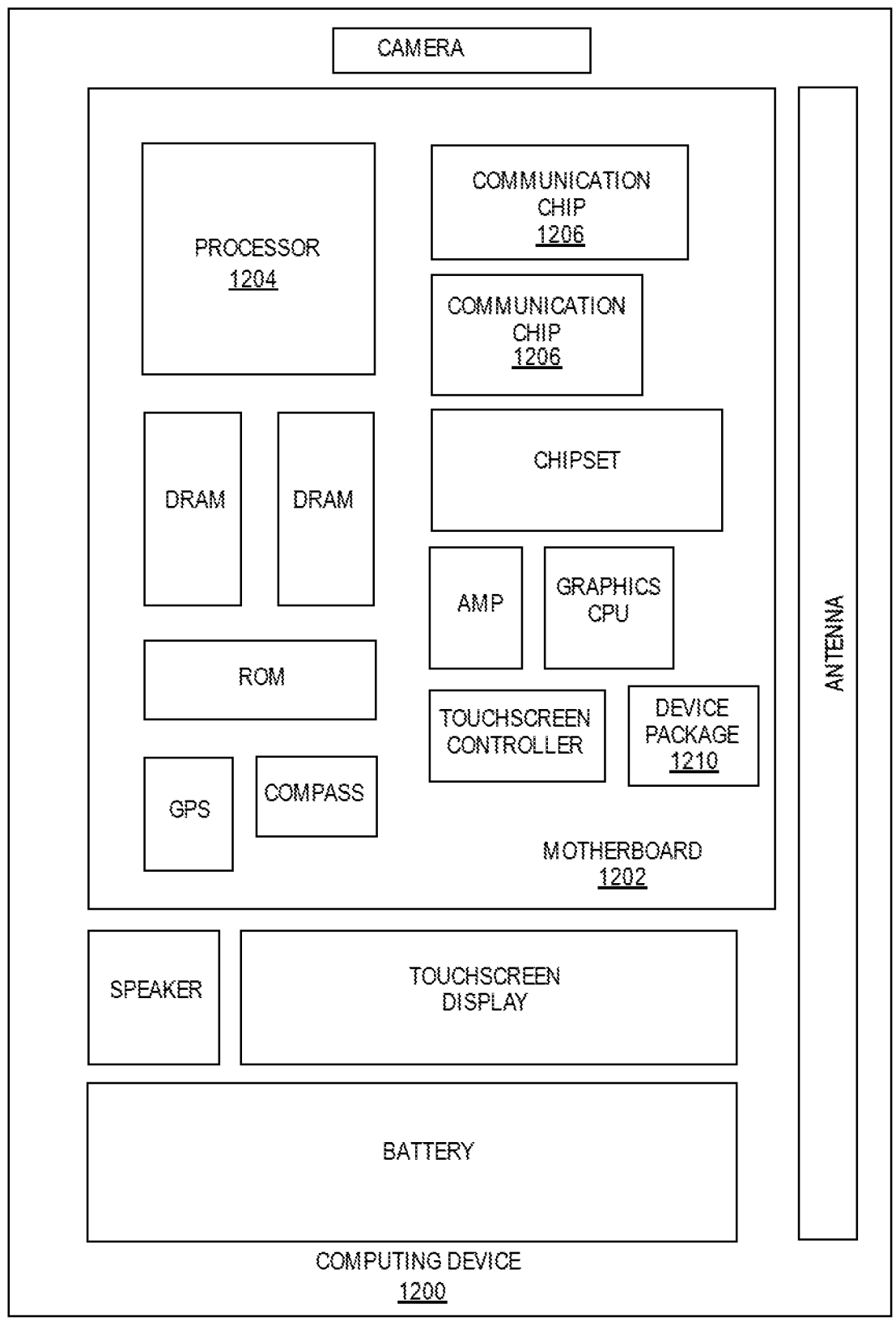
FIG. 12 is an illustration of a schematic block diagram illustrating a computer system that utilizes a semiconductor package with a plurality of dies, a plurality of patches, a plurality of bridges or substrates, an encapsulation layer, a plurality of build-up layers, and an interposer, according to one embodiment.

FIG. 12 is an illustration of a schematic block diagram illustrating a computer system that utilizes a device package 1210 (or a semiconductor package) with a plurality of dies, a plurality of patches, a plurality of bridges or substrates, an encapsulation layer, a plurality of build-up layers, and an interposer, according to one embodiment. FIG. 12 illustrates an example of computing device 1200.

Computing device 1200 houses motherboard 1202. Motherboard 1202 may include a number of components, including but not limited to processor 1204, device package 1210 (or semiconductor package), and at least one communication chip 1206. Processor 1204 is physically and electrically coupled to motherboard 1202. For some embodiments, at least one communication chip 1206 is also physically and electrically coupled to motherboard 1202. For other embodiments, at least one communication chip 1206 is part of processor 1204.

Depending on its applications, computing device 1200 may include other components that may or may not be physically and electrically coupled to motherboard 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 1206 enables wireless communications for the transfer of data to and from computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 1206 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

Processor 1204 of computing device 1200 includes an integrated circuit die packaged within processor 1204. Device package 1210 may be, but is not limited to, a substrate, a package substrate, and/or a PCB. In one embodiment, device package 1210 may be a semiconductor package as described herein. Device package 1210 may include a plurality of dies, a plurality of patches, a plurality of bridges and/or substrates, an encapsulation layer, a plurality of build-up layers, and an interposer (e.g., as illustrated in FIGS. 1A-10)—or any other components from the figures described herein.

Note that device package 1210 may be a single component/device, a subset of components, and/or an entire system, as the materials, features, and components may be limited to device package 1210 and/or any other component of the computing device 1200 that may need the POINT architecture described herein (e.g., the motherboard 1202, the processor 1204, and/or any other component of the computing device 1200 may need the embodiments of the semiconductor packages as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 1206 also includes an integrated circuit die packaged within the communication chip 1206. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiment:

Example 1 is a package substrate, comprising: a first patch and a second patch on an interposer; a first substrate in the first patch, and a second substrate in the second patch; an encapsulation layer over and around the first patch and the second patch; a plurality of build-up layers on the first patch, the second patch, and the encapsulation layer; and a plurality of dies and a bridge on the build-up layers, wherein the bridge is communicatively coupled with the first substrate of the first patch and the second substrate of the second patch.

In example 2, the subject matter of example 1 can optionally include that the bridge is an embedded multi-die interconnect bridge (EMIB).

In example 3, the subject matter of examples 1-2 can optionally include that the first and second substrates are EMIBs.

In example 4, the subject matter of examples 1-3 can optionally include that the first and second substrates are high-density packaging (HDP) substrates.

In example 5, the subject matter of examples 1-4 can optionally include that the bridge is positioned between two of the dies, and wherein the bridge is positioned over an edge of the first patch and an edge of the second patch.

In example 6, the subject matter of examples 1-5 can optionally include that the first and second substrates communicatively couple the plurality of dies to the bridge, the first and second patches, and the interposer.

In example 7, the subject matter of examples 1-6 can optionally include an underfill material on the interposer and the plurality of build-up layers, wherein the underfill material is between a top surface of the interposer and the encapsulation layer, and wherein the underfill material is on a top surface of the plurality of build-up layers and surrounds surfaces of the bridge and the plurality of dies.

In example 8, the subject matter of examples 1-7 can optionally include a top surface of the encapsulation layer is substantially coplanar to top surfaces of the first and second patches, and wherein the encapsulation layer is between the edge of the first patch and the edge of the second patch.

In example 9, the subject matter of examples 1-8 can optionally include that the first and second substrates are respectively embedded in the first and second patches, and wherein the first and second patches are embedded in the encapsulation layer.

In example 10, the subject matter of examples 1-9 can optionally include that the plurality of dies, the bridge, the first and second substrates, and the first and second patches are communicatively coupled to each other by conductive traces and vias in the plurality of build-up layers.

Example 11 is a package substrate, comprising: a first patch and a second patch on an interposer; a substrate on the first patch and the second patch; an encapsulation layer over and around the first patch and the second patch; and a plurality of dies over the substrate, the first patch, and the second patch, wherein the substrate communicatively couples the plurality of dies to the first and second patches.

In example 12, the subject matter of example 11 can optionally include that the substrate is an EMIB.

In example 13, the subject matter of examples 11-12 can optionally include that the substrate is a HDP substrate.

In example 14, the subject matter of examples 11-13 can optionally include a plurality of build-up layers on the first and second patches, the encapsulation layer, and the EMIB, wherein the plurality of dies, the EMIB, and the first and second patches are communicatively coupled to each other by conductive traces and vias in the plurality of build-up layers; and an adhesive layer coupled to a bottom surface of the EMIB and top surfaces of the first and second patches, wherein the plurality of build-up layers embed the EMIB and the adhesive layer, wherein the EMIB is positioned on an edge of the first patch and an edge of the second patch, and wherein the adhesive layer of the EMIB is on the encapsulation layer between the first and second patches.

In example 15, the subject matter of examples 11-14 can optionally include a cavity between the edge of the first patch and the edge of the second patch, wherein the EMIB is in the cavity, and wherein the plurality of build-up layers embed the EMIB and the adhesive layer in the cavity.

In example 16, the subject matter of examples 11-15 can optionally include that the HDP substrate is over the first patch, the second patch, and the encapsulation layer, and wherein the plurality of dies are on the HDP substrate.

In example 17, the subject matter of examples 11-16 can optionally include that the substrate communicatively couples the plurality of dies to the first patch, the second patch, and the interposer.

In example 18, the subject matter of examples 11-17 can optionally include an underfill material on the interposer and the plurality of build-up layers, wherein the underfill material is between a top surface of the interposer and the encapsulation layer, and wherein the underfill material is on a top surface of the plurality of build-up layers and surrounds surfaces of the plurality of dies.

In example 19, the subject matter of examples 11-18 can optionally include a first underfill material on the interposer, wherein the first underfill material is between a top surface of the interposer and the encapsulation layer, wherein the first underfill material is on a top surface of the HDP substrate and a bottom surface of the HDP substrate, and wherein the first underfill material is over the first patch, the second patch, and the encapsulation layer.

In example 20, the subject matter of examples 11-19 can optionally include a top surface of the encapsulation layer is substantially coplanar to top surfaces of the first and second patches, wherein the encapsulation layer is between the first patch and the second patch, and wherein the first and second patches are embedded in the encapsulation layer.

Example 21 is a package substrate, comprising: a first patch on an interposer; a second patch on the interposer; a plurality of dies over the first patch, the second patch, and the interposer, wherein the plurality of dies are communicatively coupled to the first and second patches.

In example 22, the subject matter of example 21 can optionally include a cavity between an edge of the first patch and an edge of the second patch; an EMIB on the edge of the first patch and the edge of the second patch, wherein the EMIB is in the cavity; a plurality of build-up layers in the cavity, wherein the plurality of build-up layers is between the edge of the first patch and the edge of the second patch, wherein the plurality of dies, the EMIB, and the first and second patches are communicatively coupled to each other by conductive traces and vias in the plurality of build-up layers; an adhesive layer coupled to a bottom surface of the EMIB and top surfaces of the first and second patches, wherein the plurality of build-up layers embed the EMIB and the adhesive layer in the cavity, wherein the EMIB is positioned on the edge of the first patch and the edge of the second patch, and wherein the adhesive layer of the EMIB is on the plurality of build-up layers between the first and second patches; and an underfill material on the interposer, wherein the underfill material is over the first and second patches, the EMIB, and the plurality of build-up layers, wherein the underfill material is between the interposer and bottom surfaces of the first patch, the second patch, and the plurality of build-up layers, and wherein the underfill material surrounds surfaces of the plurality of dies.

In example 23, the subject matter of examples 21-22 can optionally include a first HDP substrate on the first and second patches, wherein the first HDP substrate communicatively couples the plurality of dies to the first and second patches; or a second HDP substrate on the interposer, wherein the second HDP substrate communicatively couples the first and second patches to the interposer.

In example 24, the subject matter of examples 21-23 can optionally include a first underfill material on the interposer, wherein the first underfill material is between the first and second patches, wherein the first underfill material is on a top surface of the first HDP substrate and a bottom surface of the first HDP substrate, and wherein the first underfill material is over the first and second patches.

In example 25, the subject matter of examples 21-24 can optionally include a second underfill material on the interposer, wherein the second underfill material is between the first and second patches, wherein the second underfill material is on a top surface of the second HDP substrate and a bottom surface of the second HDP substrate, and wherein the second underfill material is over the first and second patches.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A package substrate, comprising:
   a first patch and a second patch on an interposer;
   a first substrate in the first patch, and a second substrate in the second patch;
   an encapsulation layer over and around the first patch and the second patch;
   a plurality of build-up layers on the first patch, the second patch, and the encapsulation layer; and
   a plurality of dies and a bridge on the plurality of build-up layers, wherein the bridge is communicatively coupled with the first substrate of the first patch and the second substrate of the second patch.

2. The package substrate of claim 1, wherein the bridge is an embedded multi-die interconnect bridge (EMIB).

3. The package substrate of claim 1, wherein the first and second substrates are EMIBs.

4. The package substrate of claim 1, wherein the first and second substrates are high-density packaging (HDP) substrates.

5. The package substrate of claim 1, wherein the bridge is positioned between two of the dies, and wherein the bridge is positioned over an edge of the first patch and an edge of the second patch.

6. The package substrate of claim 1, wherein the first and second substrates communicatively couple the plurality of dies to the bridge, the first and second patches, and the interposer.

7. The package substrate of claim 1, further comprising an underfill material on the interposer and the plurality of build-up layers, wherein the underfill material is between a top surface of the interposer and the encapsulation layer, and wherein the underfill material is on a top surface of the plurality of build-up layers and surrounds surfaces of the bridge and the plurality of dies.

8. The package substrate of claim 5, wherein a top surface of the encapsulation layer is substantially coplanar to top surfaces of the first and second patches, and wherein the encapsulation layer is between the edge of the first patch and the edge of the second patch.

9. The package substrate of claim 1, wherein the first and second substrates are respectively embedded in the first and second patches, and wherein the first and second patches are embedded in the encapsulation layer.

10. The package substrate of claim 1, wherein the plurality of dies, the bridge, the first and second substrates, and the first and second patches are communicatively coupled to each other by conductive traces and vias in the plurality of build-up layers.

11. A package substrate, comprising:
    a first patch and a second patch on an interposer;
    a substrate on the first patch and the second patch;
    an encapsulation layer over and around the first patch and the second patch; and
    a plurality of dies over the substrate, the first patch, and the second patch, wherein the substrate communicatively couples the plurality of dies to the first and second patches.

12. The package substrate of claim 11, wherein the substrate is an EMIB.

13. The package substrate of claim 11, wherein the substrate is a HDP substrate.

14. The package substrate of claim 12, further comprising:
a plurality of build-up layers on the first and second patches, the encapsulation layer, and the EMIB, wherein the plurality of dies, the EMIB, and the first and second patches are communicatively coupled to each other by conductive traces and vias in the plurality of build-up layers; and
an adhesive layer coupled to a bottom surface of the EMIB and top surfaces of the first and second patches, wherein the plurality of build-up layers embed the EMIB and the adhesive layer, wherein the EMIB is positioned on an edge of the first patch and an edge of the second patch, and wherein the adhesive layer of the EMIB is on the encapsulation layer between the first and second patches.

15. The package substrate of claim 14, further comprising a cavity between the edge of the first patch and the edge of the second patch, wherein the EMIB is in the cavity, and wherein the plurality of build-up layers embed the EMIB and the adhesive layer in the cavity.

16. The package substrate of claim 13, wherein the HDP substrate is over the first patch, the second patch, and the encapsulation layer, and wherein the plurality of dies are on the HDP substrate.

17. The package substrate of claim 11, wherein the substrate communicatively couples the plurality of dies to the first patch, the second patch, and the interposer.

18. The package substrate of claim 14, further comprising an underfill material on the interposer and the plurality of build-up layers, wherein the underfill material is between a top surface of the interposer and the encapsulation layer, and wherein the underfill material is on a top surface of the plurality of build-up layers and surrounds surfaces of the plurality of dies.

19. The package substrate of claim 16, further comprising a first underfill material on the interposer, wherein the first underfill material is between a top surface of the interposer and the encapsulation layer, wherein the first underfill material is on a top surface of the HDP substrate and a bottom surface of the HDP substrate, and wherein the first underfill material is over the first patch, the second patch, and the encapsulation layer.

20. The package substrate of claim 11, wherein a top surface of the encapsulation layer is substantially coplanar to top surfaces of the first and second patches, wherein the encapsulation layer is between the first patch and the second patch, and wherein the first and second patches are embedded in the encapsulation layer.

21. A package substrate, comprising:
a first patch on an interposer;
a second patch on the interposer;
a cavity formed at and between an edge of the first patch and an edge of the second patch; and
a plurality of dies over the first patch, the second patch, and the interposer, wherein the plurality of dies are communicatively coupled to the first and second patches.

22. The package substrate of claim 21, further comprising:
an interconnect bridge on the edge of the first patch and the edge of the second patch, wherein the interconnect bridge is in the cavity;
a plurality of build-up layers in the cavity, wherein the plurality of build-up layers is between the edge of the first patch and the edge of the second patch, wherein the plurality of dies, the interconnect bridge, and the first and second patches are communicatively coupled to each other by conductive traces and vias in the plurality of build-up layers;
an adhesive layer coupled to a bottom surface of the interconnect bridge and top surfaces of the first and second patches, wherein the plurality of build-up layers embed the interconnect bridge and the adhesive layer in the cavity, wherein the interconnect bridge is positioned on the edge of the first patch and the edge of the second patch, and wherein the adhesive layer of the interconnect bridge is on the plurality of build-up layers between the first and second patches; and
an underfill material on the interposer, wherein the underfill material is over the first and second patches, the interconnect bridge, and the plurality of build-up layers, wherein the underfill material is between the interposer and bottom surfaces of the first patch, the second patch, and the plurality of build-up layers, and wherein the underfill material surrounds surfaces of the plurality of dies.

23. The package substrate of claim 21, further comprising:
a first HDP substrate on the first and second patches, wherein the first HDP substrate communicatively couples the plurality of dies to the first and second patches; or
a second HDP substrate on the interposer, wherein the second HDP substrate communicatively couples the first and second patches to the interposer.

24. The package substrate of claim 23, further comprising a first underfill material on the interposer, wherein the first underfill material is between the first and second patches, wherein the first underfill material is on a top surface of the first HDP substrate and a bottom surface of the first HDP substrate, and wherein the first underfill material is over the first and second patches.

25. The package substrate of claim 23, further comprising a second underfill material on the interposer, wherein the second underfill material is between the first and second patches, wherein the second underfill material is on a top surface of the second HDP substrate and a bottom surface of the second HDP substrate, and wherein the second underfill material is over the first and second patches.

26. A package substrate, comprising:
a first patch on an interposer;
a second patch on the interposer;
a plurality of dies over the first patch, the second patch, and the interposer, wherein the plurality of dies are communicatively coupled to the first and second patches; and
a first high density packaging (HDP) substrate on the first and second patches, wherein the first HDP substrate communicatively couples the plurality of dies to the first and second patches; or
a second HDP substrate on the interposer, wherein the second HDP substrate communicatively couples the first and second patches to the interposer.

* * * * *